United States Patent
Inoue et al.

(10) Patent No.: US 6,460,755 B1
(45) Date of Patent: Oct. 8, 2002

(54) BUMP FORMING METHOD AND APPARATUS THEREFOR

(75) Inventors: Kosuke Inoue, Yokohama (JP); Takamichi Suzuki, Yokohama (JP); Hitoshi Odashima, Yokohama (JP); Katsuhiro Iwashita, Yokohama (JP); Tatsuya Yoneda, Kodaira (JP); Michiharu Honda, Yokohama (JP); Katuhisa Tanaka, Ayase (JP); Tsuyoshi Yamaguchi, Hadano (JP); Tetsuo Murakami, Atsugi (JP); Asahi Tsuchiya, Atsugi (JP); Yoshitatsu Naito, Ebina (JP); Mitsuhiro Suzuki, Zama (JP); Izumi Hata, Odawara (JP); Kouji Sajiki, Ebina (JP)

(73) Assignees: Hitachi, Ltd., Tokyo (JP); Hitachi Seiko Ltd., Ebina (JP)

( * ) Notice: Subject to any disclaimer, the term of this patent is extended or adjusted under 35 U.S.C. 154(b) by 0 days.

(21) Appl. No.: 08/813,577

(22) Filed: Mar. 7, 1997

(30) Foreign Application Priority Data

Mar. 8, 1996 (JP) .............................................. 8-051316

(51) Int. Cl.[7] .......................... B23K 5/00; B23K 20/14; B23K 31/02; B23K 35/12
(52) U.S. Cl. .................... 228/246; 228/41; 228/180.22; 228/224; 228/245
(58) Field of Search ............................... 228/9, 19, 22, 228/41, 224, 246, 253, 245, 180.22, 248.1

(56) References Cited

U.S. PATENT DOCUMENTS

| | | | |
|---|---|---|---|
| 4,752,027 | * 6/1988 | Gschwend | 228/180.2 |
| 5,088,639 | * 2/1992 | Condotra et al. | 228/246 |
| 5,205,896 | * 4/1993 | Brown et al. | 156/297 |
| 5,279,045 | 1/1994 | Odashima et al. | |
| 5,284,287 | * 2/1994 | Wilson et al. | 228/180.2 |
| 5,372,294 | * 12/1994 | Gore et al. | 228/105 |
| 5,431,332 | * 7/1995 | Kirby et al. | 228/246 |
| 5,439,162 | * 8/1995 | George et al. | 228/180.22 |
| 5,467,913 | * 11/1995 | Namekawa et al. | 228/41 |
| 5,601,229 | * 2/1997 | Nakazato et al. | 228/246 |
| 5,620,927 | * 4/1997 | Lee | 29/841 |
| 5,626,277 | * 5/1997 | Kawada | 228/246 |
| 5,680,984 | * 10/1997 | Sakemi | 228/246 |
| 5,687,901 | * 11/1997 | Hoshiba et al. | 228/246 |
| 5,692,292 | * 12/1997 | Asai et al. | 29/740 |
| 5,695,667 | * 12/1997 | Eguchi et al. | 219/388 |
| 5,745,986 | * 5/1998 | Variot et al. | 29/840 |
| 5,749,614 | * 5/1998 | Reid et al. | 294/64.01 |
| 5,788,143 | * 8/1998 | Boyd et al. | 228/253 |
| 5,831,247 | * 11/1998 | Hidaka | 228/246 |
| 5,890,283 | * 4/1999 | Sakemi et al. | 29/840 |
| 5,983,490 | * 11/1999 | Sakemi | 29/833 |
| 6,013,899 | * 1/2000 | Eguchi et al. | 219/388 |
| 6,213,386 | * 4/2001 | Inoue et al. | 228/245 |

FOREIGN PATENT DOCUMENTS

| | | | | |
|---|---|---|---|---|
| JP | 5-129374 | 5/1993 | | |
| JP | 7-307344 | 11/1995 | | |
| JP | 8-153960 | 6/1996 | | |
| JP | 8-335771 A | * 12/1996 | | 228/246 |

* cited by examiner

Primary Examiner—M. Alexandra Elve
Assistant Examiner—Lynne Edmondson
(74) Attorney, Agent, or Firm—Antonelli, Terry, Stout & Kraus, LLP

(57) ABSTRACT

There are disclosed a solder bump forming method and an apparatus therefor, which achieve a high reliability, and an electronic part, produced by this method and this apparatus, is also disclosed. For each of the step of arraying solder balls, the step of supplying a flux, and the step of mounting the solder balls on a board, it is checked whether or not any solder ball is omitted, and the process is conducted while confirming the condition of the operation, thereby enhancing the reliability and also preventing defective products from being produced.

7 Claims, 33 Drawing Sheets

FIG. 44

| DISTANCE FROM FLUX LIQUID SURFACE TO RESISTANCE PLATE | CONDITION OF RISING (WETTING) OF FLUX |
|---|---|
| 6mm | |
| 0.4mm | |
| 0.2mm | |

DIRECTION TOWARD LIGHT SOURCE

DIRECTION TOWARD CAMERA

EVACUATION TO VACUUM

BUMP FORMING METHOD AND APPARATUS THEREFOR

BACKGROUND OF THE INVENTION

1. Field of the Invention

This invention relates to a bump forming method in which conductive balls (represented by solder balls or gold balls) are mounted and formed on the type of semi-conductor package (hereinafter referred to merely as "package"), such as a BGA (Ball Grid Array) package and a CSP (Chip Size Package or Chip Scale Package), in which solder balls are used as a connecting material for connecting an electronic part to a current board. The invention also relates to an apparatus for performing this bump forming method, and to an electronic part formed by this method.

2. Related Art

As shown in FIGS. 65A and 65B, in a package such as a BGA package, an LSI chip 2005 is mounted on one side or face of a board 2001, and terminals of the LSI chip 2005 are connected respectively to terminals of the board 2001 by lead wires 2006 made of gold or gold-plated aluminum, and the LSI chip 2005 is sealed on the board 2001 by a sealing resin 2002, and then solder bumps 2000 are formed respectively on pads 2003 exposed through a resist film 2004 formed on the other side of the board 2001.

One method of forming these solder bumps 2000 is disclosed in U.S. Pat. No. 5,284,287. This U.S. Patent discloses a technique in which solder balls, vacuum picked up by an arraying jig (suction jig), are immersed in a flux reservoir, thereby applying a flux to the solder balls, and these solder balls are mounted respectively on pads (connection terminals) formed on an electronic circuit board, and the electronic circuit board, holding the solder balls by the adhesive force of the flux, is heated (reflowed), thereby forming the solder bumps.

U.S. Pat. No. 5,279,045 also discloses a method of forming solder bumps. This U.S. Patent discloses a technique in which solder balls are supplied to an arraying jig (suction jig) by a gas flow, and the solder balls are mounted on a semiconductor device, and then are heated, thereby forming bumps.

FIGS. 66 to 68 show one example of a conventional solder ball mounting machine. Blocks 2 are fixedly mounted on a base 1 in parallel relation to each other. Linear guides 3 are fixedly mounted respectively on the blocks 2 in parallel relation to each other. A beam 4 is movably supported on the linear guides 3. A feed screw 5 is rotatably supported on the block 2, and is threadedly engaged with a nut (not shown) fixedly mounted on the beam 4. A motor 6 is supported on the base 1, and is connected to the feed screw 5. Therefore, when the motor 6 is operated, the beam 4 is moved in a Y direction (upward and downward in FIG. 66).

Linear guides 7 are fixedly mounted on the beam 4 in parallel relation to each other. A slider 8 is movably supported on the linear guides 7. A feed screw 9 is rotatably supported on the beam 4, and is threadedly engaged with a nut (not shown) fixedly mounted on the slider 8. A motor 10 is supported on the beam 4, and is connected to the feed screw 9. Therefore, when the motor 10 is operated, the slider 8 is moved in an X direction (right and left in FIG. 66).

Linear guides 11 are fixedly mounted on the slider 8 in parallel relation to each other. A saddle 12 is movably supported on the linear guides 11. A feed screw 13 is rotatably supported on the slider 8, and is threadedly engaged with a nut (not shown) fixedly mounted on the saddle 12. A motor 14 is fixedly mounted on the slider 8, and is connected to the feed screw 13.

Therefore, when the motor 14 is operated, the saddle 12 is moved in a Z direction (upward and downward in FIG. 67).

An arraying jig (suction jig) 15 is fixedly mounted on the saddle 12. This arraying jig 15 is formed into a box-like shape, and a plurality of holes 17 for respectively suction-holding solder balls 16 in the same array as the array of solder balls to be mounted on a package are formed in a lower surface of the arraying jig 15.

A solder ball supply device 19 is fixedly mounted on the base 1, and holds the solder balls 16 therein. This solder ball supply device 19 is formed into a box-shape having an open top, and a plurality of holes smaller in diameter than the solder ball 16 are formed in its bottom surface.

A flux supply device 20 is fixedly mounted on the base 1, and the solder balls 16 are immersed a predetermined depth in a flux 21 in this flux supply device 20, thereby applying the flux 21 to the solder balls 16.

A package 24 on which the solder balls 16 are to be mounted is conveyed by belts 22, and is brought into engagement with stoppers 23 to be positioned.

In this construction, the motor 6 and the motor 10 are operated to position the arraying jig 15 above the ball supply device 19. Then, the motor 14 is operated to move the arraying jig 15 downward until the lower end of the arraying jig 15 covers the open top of the ball supply device 19. Then, compressed air is injected from the bottom surface of the ball supply device 19 to float the solder balls 16 between the arraying jig 15 and the bottom surface of the ball supply device 19. At the same time, vacuum pressure is supplied to the arraying jig 15, thereby drawing the air through the holes (suction holes) 17, so that the solder balls 16 are suction-held in the holes 17 in the arraying jig 15.

Upon lapse of a predetermined time period, the compressed air, injected from the bottom surface of the ball supply device 19, is interrupted, and the motor 14 is operated to move the arraying jig 15, suction-holding the solder balls 16, upward.

Then, the motor 6 and the motor 10 are operated to move the arraying jig 15, suction-holding the solder balls 16, into a position above the flux supply device 20. Then, the motor 14 is operated to move the arraying jig 15 downward until the lower ends (about ¼ to ⅓ of the diameter of the solder ball) of the solder balls 16, suction-held on the lower surface of the arraying jig 15, are immersed into the flux 21, thereby supplying the flux 21 to the solder balls 16. After the flux 21 is thus supplied to the solder balls 16, the motor 14 is operated to move the arraying jig 15 upward.

Then, the motor 6 and the motor 10 are operated to move the arraying jig 15, suction-holding the solder balls 16 supplied with the flux at their lower ends, into a position above a mounting position where the solder balls are transferred and mounted onto the package 24. At this time, the package 24, positioned in engagement with the stoppers 23, is beforehand located in the mounting position. When the arraying device 15 is located in the predetermined position above the package 24, the motor 14 is operated to move the arraying jig 15 downward, so that the solder balls 16 approach the package 24.

At this time, compressed air is supplied into the arraying jig via a pipe 18. This compressed air is injected from the holes 17, so that the suction-held solder balls 16 are released, and are mounted onto the package 24. The solder balls 16 thus mounted on the package 24 are held on the package 24 by the viscous nature of the flux supplied to the lower ends of the solder balls 16. Then, the motor 14 is operated to move the arraying jig 15 upward, and the arraying jig 15 is further moved so as to suction hold the next hold solder balls 16.

However, the above conventional method has the following problems.

In the above solder ball mounting machine, the operations are effected sequentially, and therefore the time required for one cycle is long (about 15 seconds), and the production ability of the solder ball mounting machine is low.

When the kind of the package is changed, the arraying jig must be changed, and the cost, required for preparing many kinds of expensive arraying jigs, and the time and labor, required for changing the arraying jig, offer a problem. In the steps of the above method, one or more solder balls may be omitted in the arraying jig, and also the package and the arraying jig may be improperly registered with each other, and as a result the required number of solder balls are not all mounted on the package, and the solder balls are improperly registered with the pads when mounting the solder balls on the package, so that the defective products are produced.

In the suction holding of the solder balls, if even only one of many suction holes in the arraying jig fails to suction hold the solder ball, the defective product is produced when the solder balls, suction held on the arraying jig, are mounted onto the package, and therefore it is indispensable for all of the suction holes to suction hold the solder balls. If any of the suction holes fails to suction hold the solder ball, it is necessary to cause the vacant suction hole to suction hold the solder ball by repeating the solder ball suction-holding operation. In order to positively achieve the suction holding of the solder balls so as to minimize this repeated operation, the solder balls need to be supplied uniformly to all of the suction holes by blowing the air, but there is encountered a problem that it is difficult to achieve this with respect to the suction holes arranged in a plane.

Further, if the arraying jig has an increased area, it is difficult to blow the solder balls up over an entire area of the container so as to supply the solder balls to a region near to the suction holes in the arraying jig, and as a result there is encountered a problem that the omission of the solder balls may occur frequently.

As shown in FIG. 69, when the lower ends of the solder balls 16, suction held by the arraying jig 15, are immersed in the flux 21 having good wettability, the flux 21 may wet the suction balls to cover them, and may contaminate the arraying jig 15. Once the flux 21 contaminates the arraying jig 15, the transfer of the solder balls from the arraying jig 15 to the board can not be effected perfectly because of the adhesive force of the flux 21, and therefore there is encountered a problem that each time this transfer is to be effected, the arraying jig 15 must be cleaned.

When the package is warped, those solder balls, brought into contact with the associated pads, can be positively mounted on the board, but those solder balls, held out of contact with the associated pads, drop onto the associated pads, so that misregistration of the solder balls may occur. And besides, as shown in FIG. 70, a pressing force 1314, acting on the solder ball 1302 when mounting the solder ball 1302 onto the board 1311, has a component force 1313, acting perpendicular to the board 1311, and a component force 1312 acting parallel to the plane of the board 1311. The parallel component force 1312 tends to displace the solder ball 1302 from the pad 1309, and because of this force, the solder ball 1302 may be out of registry with the pad 1309. In this case, the bump of a good quality can not be formed.

Further, as shown in FIG. 71, when the flux 1319 adheres to the solder ball 1302 in a misregistered manner, even the solder ball 1302 (indicated in a broken line), mounted on a solder ball mounting position, may be displaced to a position, indicated in a solid line, by a fluid force such as a surface tension of the flux 1319. In this condition, even if the solder ball is melted again by the reflow, the solder ball 1309 can easily move to combine with other solder ball or to be flowed away since the solder ball 1309 is not held in contact with the pad 1309. As a result, the bump of a good quality is formed on the pad 1309, and the resultant bump is defective.

Further, as shown in FIG. 72, if a foreign matter 1316 is present at a region where the rupture of an oxide film 1315 on the solder ball 1302 is started, the solder will not be spread over the pad 1309, and therefore the oxide film 1315 can not be sufficiently removed from the solder ball 1302, so that a defective solder bump, in which the solder ball 1302 is incompletely bonded to the pad 1309, is formed.

SUMMARY OF THE INVENTION

It is an object of this invention to provide a bump forming method which overcomes the above problems of the prior art, and achieves a high reliability and a high production ability, and also to provide an apparatus therefor and an electronic part produced by this method and this apparatus.

According to one aspect of the present invention, there is provided a bump forming method comprising the steps of:

causing an arraying jig to vacuum pick up conductive balls;

applying an adhesive liquid, comprising one of a flux, a solder paste and a conductive particle-filled adhesive, to the conductive balls;

registering the conductive balls respectively with pads on an electronic part;

pressing the conductive balls respectively against the pads on the electronic part to mount the conductive balls thereon; and heat treating the electronic part having the conductive balls mounted thereon.

According to another aspect of the invention, there is provided a bump forming apparatus comprising:

means for causing an arraying jig to vacuum pick up conductive balls;

means for applying an adhesive liquid, comprising one of a flux, a paste and a conductive particle-filled adhesive, to the conductive balls;

means for registering the conductive balls respectively with pads on an electronic part;

means for pressing the conductive balls respectively against the pads on the electronic part to mount the conductive balls thereon; and means for heat treating the electronic part having the conductive balls mounted thereon.

BRIEF DESCRIPTION OF THE DRAWINGS

FIG. 44 is a characteristic view showing flux wetting prevention effects achieved by a resistance plate;

DESCRIPTION OF THE PREFERRED EMBODIMENTS

A preferred embodiment of the present invention will now be described with reference to the drawings.

Figure 1:
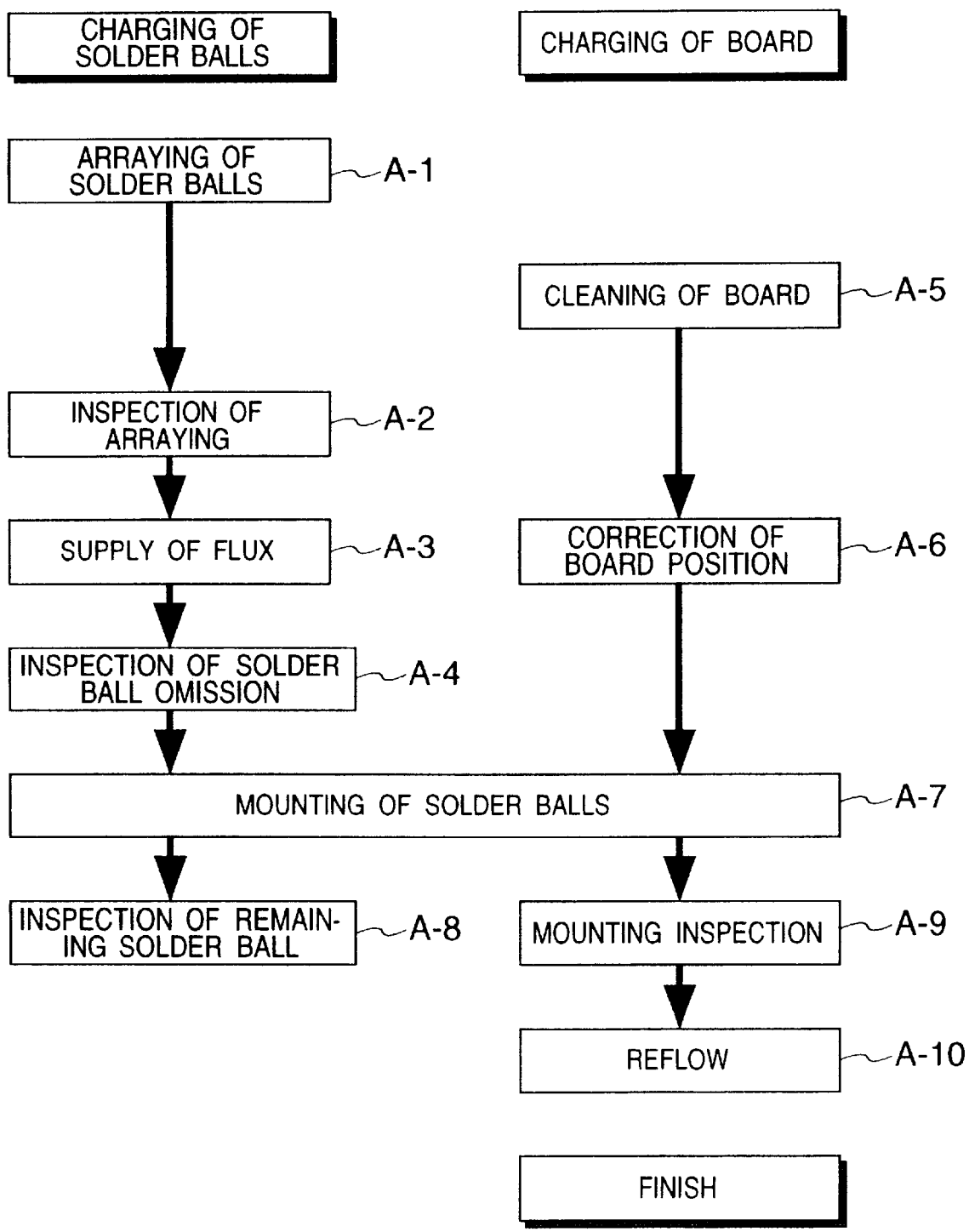
FIG. 1 is a flow chart showing a solder bump forming process of the present invention.
Figure 2:
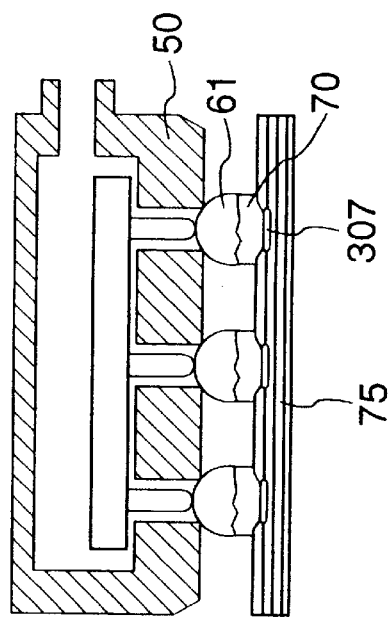
FIG. 2 is a process view showing a process step in FIG. 1.
Figure 3A:
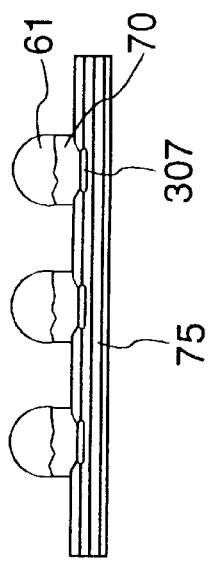
FIGS. 3A and 3B are process views showing a process step in FIG. 1.
Figure 3B:
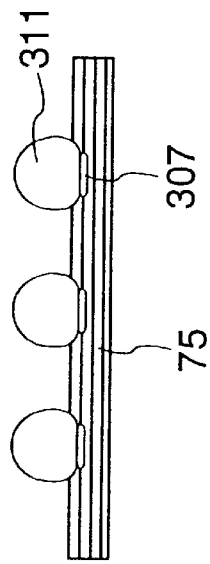

In the present invention, as shown in FIG. 2, first, solder balls 61 are vacuum picked up (or suction held) and arrayed by an arraying jig (suction jig) 50 (Step A-1 in FIG. 1). Then, it is checked whether or not this arraying is good (Step A-2 in FIG. 1). Then, as shown in FIG. 3A or 3B, a flux 70a (or 70b) is supplied to the solder balls 61 (Step A-3 in FIG. 1). Then, it is checked whether or not any of the solder balls 61 has been disengaged from the arraying jig 50 (that is, any solder ball has been omitted from the solder ball array) when the flux was supplied (Step A-4 in FIG. 1). Thus, there are prepared the arrayed solder balls 61 supplied with the flux 70a or 70b.

Figure 4:
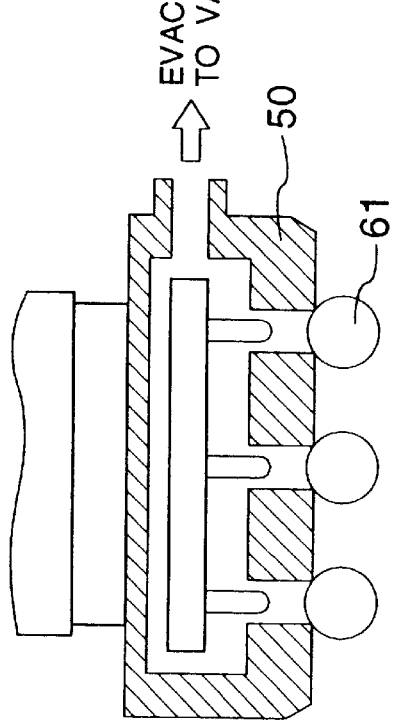
FIG. 4 is a process view showing a process step in FIG. 1.

On the other hand, a bump forming surface is cleaned if necessary (Step A-5 in FIG. 1). A cleaned board is fed to a solder ball mounting machine, and then pads (on which bumps are to be formed, respectively) on the board are located in solder ball mounting positions, respectively (Step A-6 in FIG. 1). Then, as shown in FIG. 4, the solder balls 61 are mounted onto a package 75 thus positioned (Step A-7 in FIG. 1). Then, it is checked whether or not any solder ball 61 remains on the suction surface of the arraying jig 50 used to array the solder balls 61 (Step A-8 in FIG. 1), and an inspection is effected to confirm the number of the solder balls 61 on the pads 307 of the package 75 and also to confirm misregistration of these solder balls 61 (Step A-9 in FIG. 1), thereby determining whether or not the solder balls 61 have been properly and accurately mounted on the package.

Figure 5:
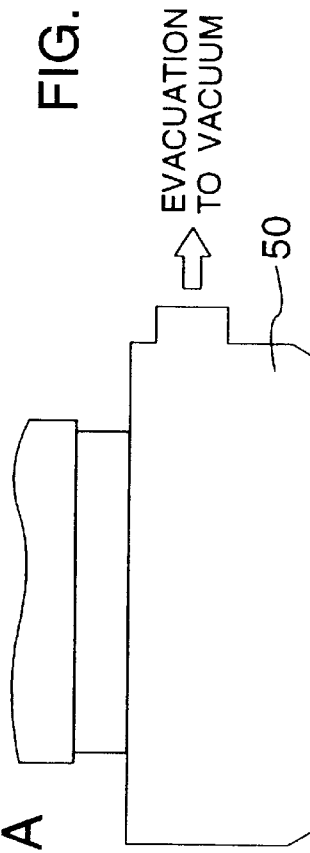
FIG. 5 is a process view showing a process step in FIG. 1.
Figure 6:
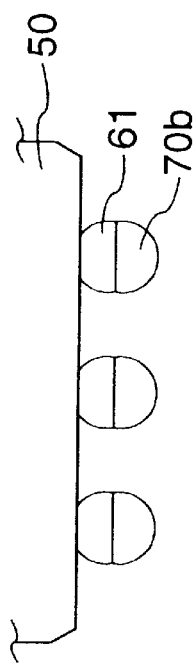
FIG. 6 is a process view showing a process step in FIG. 1.

The package 75, having the solder balls 61 thus mounted thereon as shown in FIG. 5, is placed in a high-temperature environment, so that the solder balls melt, and are joined respectively to the pads on the board, and then are cooled (Step A-10 in FIG. 1), and as a result solder bumps 311 are formed respectively on the pads 307 of the package 75, as shown in FIG. 6.

Next, a second embodiment of the present invention will be described with reference to FIGS. 7 to 12. A shaft 27 is rotatably supported on a housing 25, mounted on a base 1, through bearings 26. A servo motor 29 is supported on a plate 28 fixedly secured to a lower end of the housing 25. The shaft 27 can be rotated to be indexed at an arbitrary angle by the servo motor 29 through timing belt pulleys 30 and 31 and a timing belt 32.

Air supply-discharge passage 33 is formed in the shaft 27. A rotary joint 34 is fixed to the plate 28 through a bracket 35, and is rotatably fitted on the shaft 27 in opposed relation to an open portion of the air supply-discharge passage 33 formed in an outer peripheral surface of the shaft 27. A slip ring 36 is fixed to the rotary joint 34 through a bracket 37, and is opposed to the lower end of the shaft 27. A disk 38 is formed integrally with the shaft 27.

An air cylinder 39 is fixedly mounted at a central portion of the disk 38. When this air cylinder 39 is operated, a table 41 is moved upward and downward.

Figure 9:
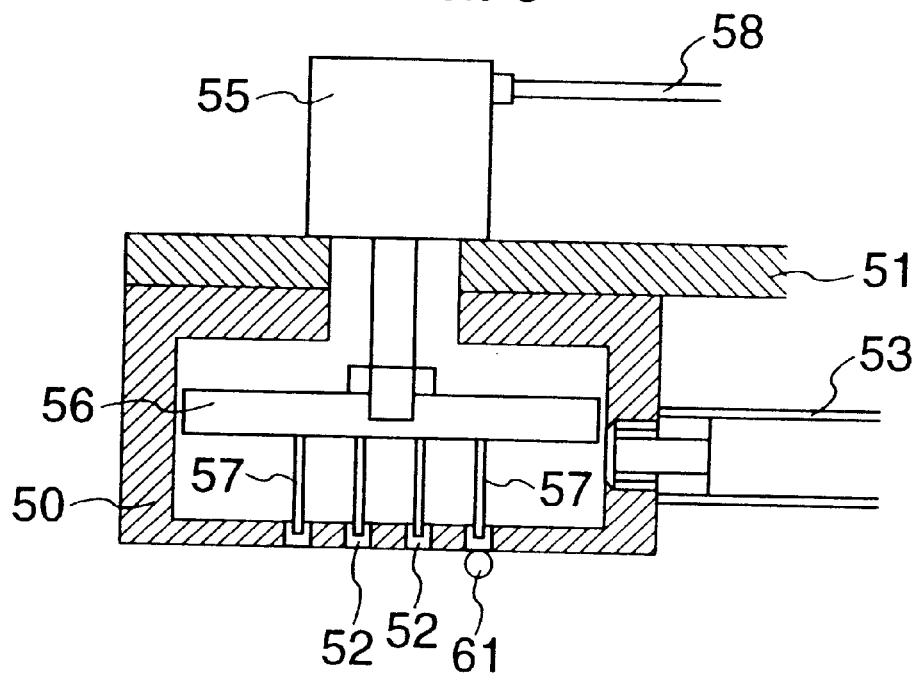
FIG. 9 is a cross-sectional view of an arraying jig in FIG. 7.

The arraying jigs 50 are fixedly secured to the table 41 through respective plates 51, and are circumferentially spaced at predetermined intervals (of 120 degrees in this embodiment). The arraying jig 50 is constructed as shown in FIG. 9. The arraying jig 50 is formed into a box-like shape, and holes 52 for respectively suction holding the solder balls 61 are formed in a predetermined pattern in a lower surface thereof. A pipe 53 connects the arraying jig 50 to the air supply-discharge passage 33 formed in the shaft 27, and a vacuum pressure is supplied to the arraying jig 50 through the pipe 53.

An array of pins 57 are arranged on a plate 56 in the same pattern as that of the holes 52 formed in the lower surface of the arraying jig 50, and the pins 57 are smaller in diameter than the holes 52 so that the pins 57 can pass through the holes 52, respectively. A pipe 58 connects a cylinder 55 to the air supply-discharge passage 33 formed in the shaft 27.

When suction holding (vacuum picking up) the solder balls 61, the cylinder 55 is operated to move the plate 56 upward, thereby moving the array of pins 57 into a position above the holes 52. When mounting the suction held solder balls 61 onto the package, the cylinder 55 is operated to move the plate 56 downward, so that the array of pins 57 are passed respectively through the holes 52 to press the respective solder balls 61 toward the package, and by doing so, the solder balls 61 can be more positively transferred from the arraying jig 50 to the package.

Figure 8:
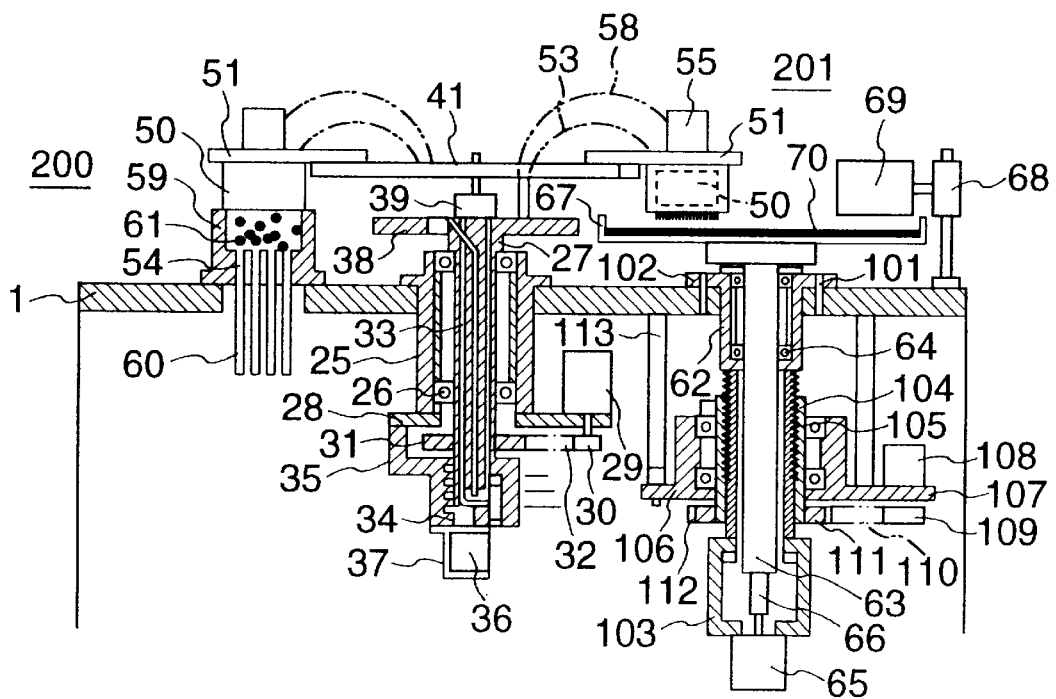
FIG. 8 is a front-elevational view of the solder ball mounting machine of FIG. 7.

In a solder ball supply device 200, as shown in FIG. 8, a solder ball hopper 59 has an open top, and holds the solder balls 61 therein, and a plurality of holes 54 smaller in diameter than the solder ball 61 are formed through a bottom wall thereof, and this hopper 59 is fixedly mounted on the base 1. The open top of the hopper 59 is covered with the arraying jig 50, and compressed air is supplied into the hopper 59 through air pipes 60 and the holes 54 in the bottom wall, so that the solder balls 61 are floated between the inner bottom surface of the hopper 59 and the arraying jig 50. By evacuating the interior of the arraying jig 50 through the suction or evacuation pipe 53, the solder balls 61 can be suction held in the respective holes 52 in the arraying jig 50.

Figure 7:
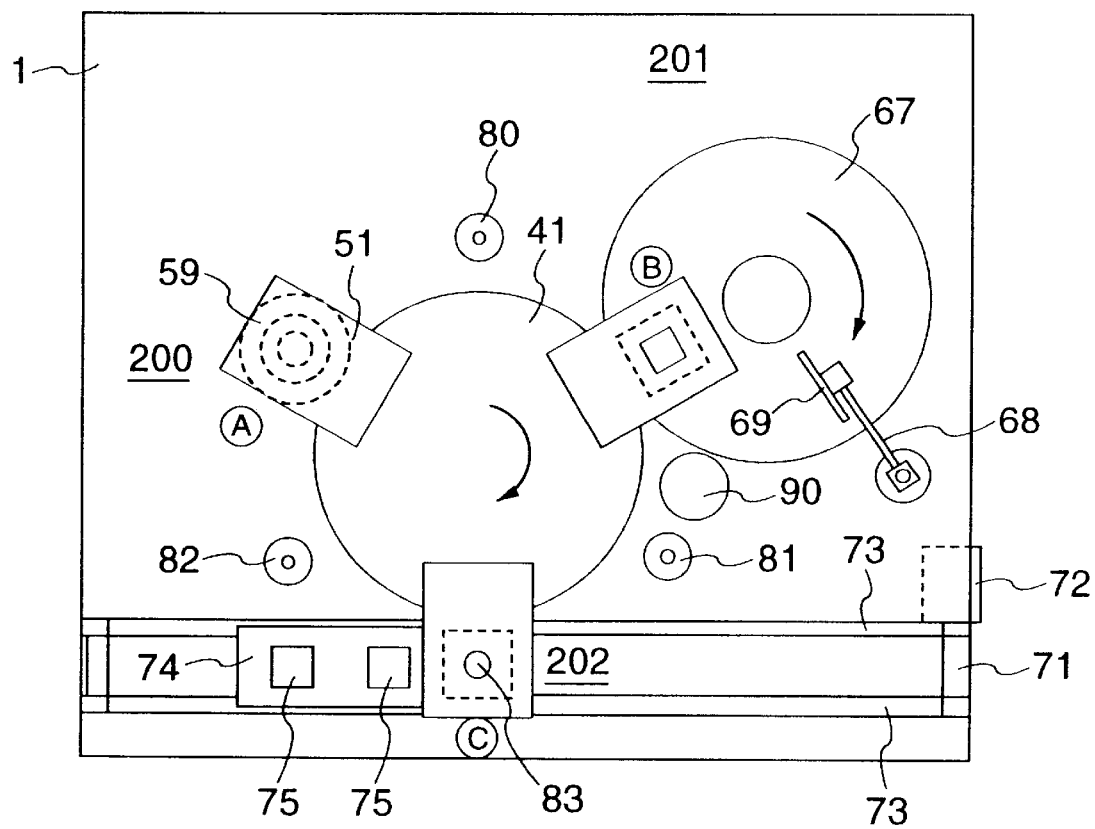
FIG. 7 is a plan view of a solder ball mounting machine of the invention.

A flux supply device 201 is constructed as shown in FIGS. 7 and 8. A thread 104 is formed on an outer peripheral surface of a lower portion of a housing 62, and a flange 102 is formed at an upper end of the housing 62. Guide pins 101, fixedly mounted on the base 1, are slidably fitted respectively in holes, formed through the flange 102, so that the flange 102 can move upward and downward relative to the base 1. A shaft 63 is rotatably supported on the housing 62 through bearings 64.

A motor 65 is supported on a housing 103 supported at the lower end of the housing 62, and an output shaft of this motor 65 is connected to the shaft 63 through a coupling 66.

A housing 107 is supported on the lower surface of the base 1 through stud bolts 113 in coaxial relation to the housing 62. A nut 105 is threadedly engaged with the thread 104 on the housing 62, and is rotatably supported on the housing 107 through bearings 106. A stepping motor 108 is mounted on the housing 107. A timing belt pulley 111 is fixed to the nut 105. A timing belt 110 is extended around the timing belt pulley 111 and a timing belt pulley 109.

Therefore, when the stepping motor 108 is operated, the nut 105 is rotated through the timing belt pulley 109, the timing belt 110 and the timing belt pulley 111. As a result, the housing 62, as well as the shaft 63 supported on this housing 62, is moved in a direction of its axis through the thread 104. When the motor 65 is operated, the shaft 63 is rotated.

A reservoir 67 is fixedly mounted on the upper end of the shaft 63. A sheet, made of an elastic material such as rubber and an elastic plastics material, is provided at a bottom surface of the reservoir 67. A squeegee 69 is spaced a predetermined distance from the sheet, provided at the bottom surface of the reservoir 67, in opposed relation thereto, and can be driven by drive means (not shown) so as to move along a stand 68 fixedly mounted on the base 1.

The flux 70 is supplied to be held on the sheet in the reservoir 67. In accordance with the size of the solder balls 61, the shaft 63 is moved by operating the stepping motor 108, thereby adjusting the height or level of the reservoir 67, and also the position of the squeegee 69 is adjusted. The stepping motor 65 is operated to rotate the reservoir 67, so that the flux 70 is spread over the sheet by the squeegee 69. As a result, the flux 70 is formed into a liquid film having a predetermined thickness (corresponding to the distance between the squeegee 69 and the sheet provided at the bottom surface of the reservoir 67). By controlling the thickness of this flux 70, the amount of supply of the flux 70 to the solder balls 61 can be adjusted.

As shown in FIG. 7, a CCD camera 80 is provided between the solder ball supply device 200 and the flux supply device 201, and a CCD camera 81 is provided between the flux supply device 201 and a positioning device 202, and a CCD camera is provided between the positioning device 202 and the solder ball supply device 200. The CCD cameras 80, 81 and 82 are spaced at predetermined intervals, and can face the lower surface of each arraying jig 50. A CCD camera 83 is provided above the solder ball mounting position (where the solder balls 61 are mounted onto the package 75) so that this camera 83 can face the package 75. The CCD cameras 80, 81, 82 and 83 are connected to an image processing device 84. The image processing device 84 is connected to a controller 85.

Figure 10:
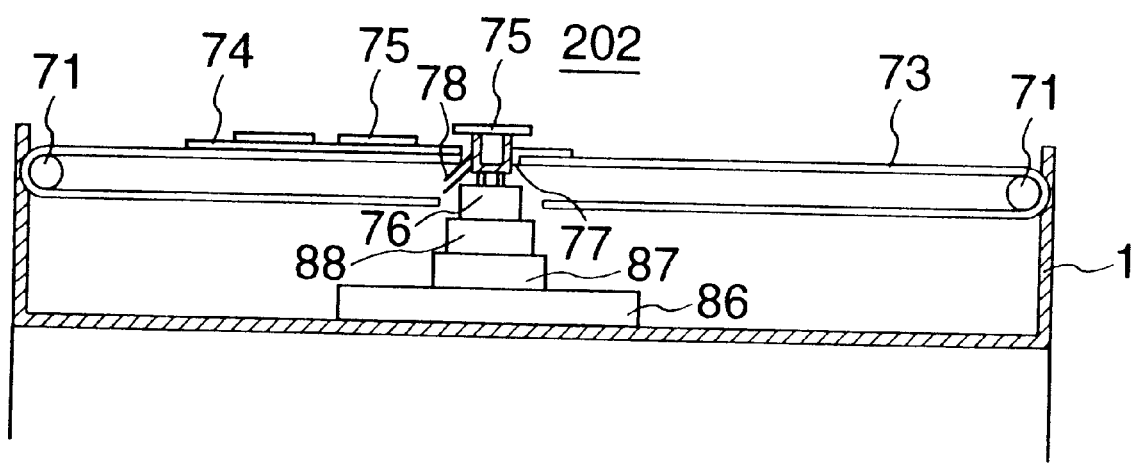
FIG. 10 is a side-elevational view of a ball mounting station in FIG. 7.
Figure 11:
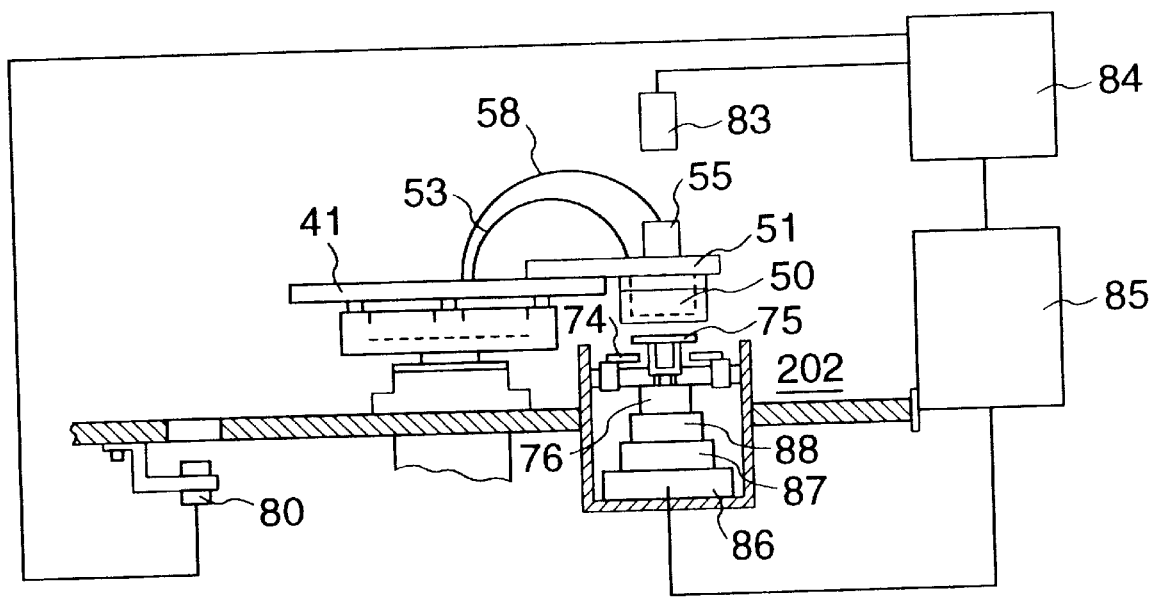
FIG. 11 is a front-elevational, cross-sectional view of the ball mounting station in FIG. 7.

The positioning device 202 is constructed as shown in FIGS. 7, 10 and 11. Rollers 71 are rotatably supported on the base 1. An output shaft of a motor 72, supported on the base 1, is connected to the roller 71. A belt 73 is extended around the rollers 71. A carriage 74, carrying the packages 75, is placed on the belt 73. Through holes are formed through the carriage 74, and the packages 75 are mounted respectively in these through holes.

A y-axis linear stage 86 is supported on the base 1, and an x-axis linear stage 87 is movably supported on this y-axis linear stage 86. A θ rotating stage 88 is rotatably supported on the x-axis linear stage 87. A lift nozzle 77, having a pipe 78 connected to a vacuum source, is mounted on the θ rotating stage through a cylinder 76. The y-axis linear stage 86, the x-axis linear stage 87 and the θ rotating stage 88 are moved in response to instructions from the controller 85.

When the carriage 74, having the packages 75 placed thereon, is placed on the belt 73, the motor 72 is operated to convey the carriage 74. Then, when the carriage 74 is stopped at a predetermined position by positioning means (not shown) such as a stopper, the cylinder 76 is operated.

The lift nozzle 77 moves upward, and holds the package by suction (vacuum), and further transfers the package 75 from the carriage 74 to the ball mounting position.

Then, the image processing device 84 recognizes the positions of the pads on the package 75 through the CCD camera 83. The controller 85 drives the y-axis linear stage 86, the y-axis linear stage 87 and the θ rotating stage 87 so that the pads of the package 75 can be registered respectively with the solder balls 61 suction-held by the arraying jig 50. As a result, the solder balls 61 can be mounted respectively onto the pads of the package 75 more accurately.

With the above construction, the solder balls 61 are mounted respectively onto the pads of the package 75 in a manner described below.

First, the table 41 is rotated to be indexed by operating the servo motor 29. The arraying jig 50, positioned at a position A, is opposed to the solder ball supply device 200, and another arraying jig 50, positioned at a position B, is opposed to the liquid film of flux 70 in the reservoir 67 of the flux supply device 201, and the other arraying jig 50, positioned at a position C, is opposed to the package 75 positioned by the positioning device 202. Then, the cylinder 39 is operated to lower the table 41, thereby moving the arraying jigs 50 downward into their respective predetermined positions.

The arraying jig 50, located at the position A, covers the open top of the ball hopper 59. Then, the compressed air is supplied from the bottom surface of the ball hopper 59, and at the same time a vacuum pressure is supplied into the arraying jig 50. The solder balls 61, blown up by the compressed air, are suction held by the arraying jig 50.

The arraying jig 50, located at the position B, is lowered until the solder balls 61, held by the arraying jig 50, are brought into contact with the sheet provided at the reservoir 67. As a result, the lower ends of the solder balls 61 are immersed in the liquid film of flux 70, so that the flux 70 adheres to the solder balls 61.

The arraying jig 50, located at the position C, is lowered until the solder balls 61, suction held by this arraying jig, are brought into contact with the package 75. Then, the interior of the arraying jig is made open to the atmosphere, thereby releasing the solder balls 61. At the same time, the cylinder 55 is operated to lower the plate 56 to project the array of pins 57 through the respective holes 52 toward the package 75, thereby forcibly transferring the solder balls 61 from the arraying jig 50 to the package 75. The solder balls 61 thus mounted on the package 75 are adhesively held on the package 75 by the viscous nature of the flux 70 applied to the lower ends of these solder balls.

Figure 12:
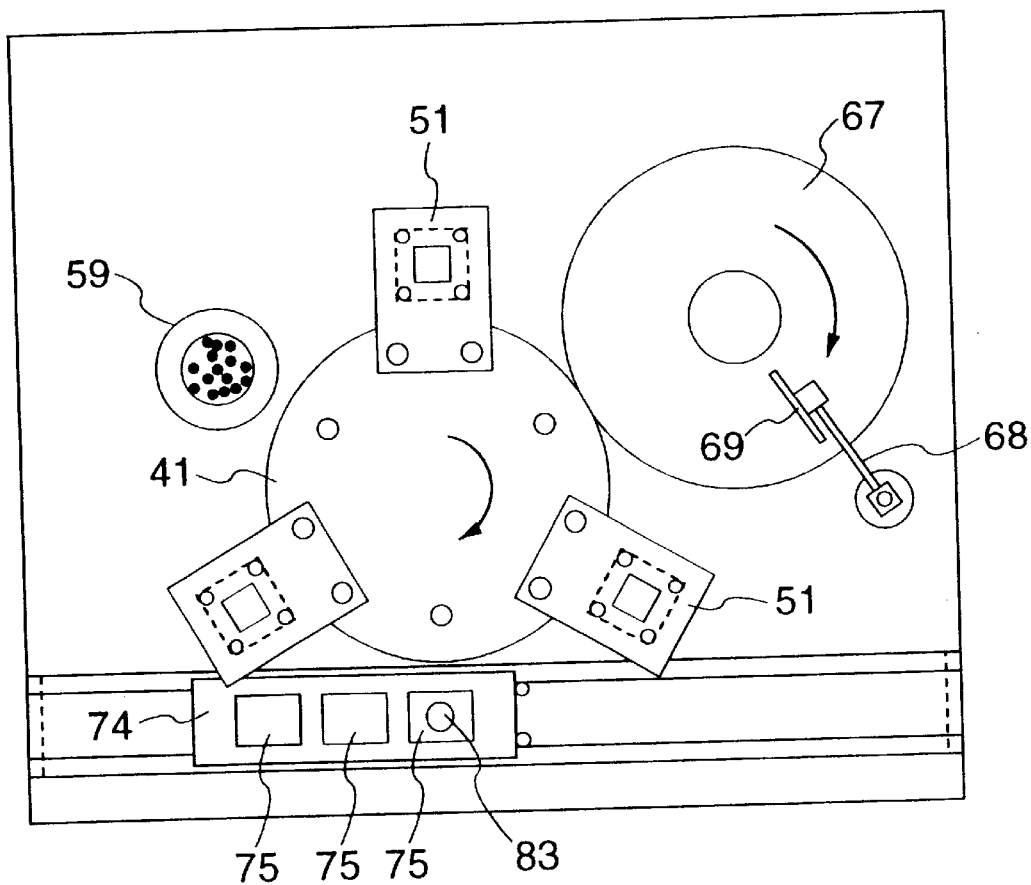
FIG. 12 is a plan view showing a stop position of a table at the time of detecting solder balls in FIG. 7.
Figure 13:
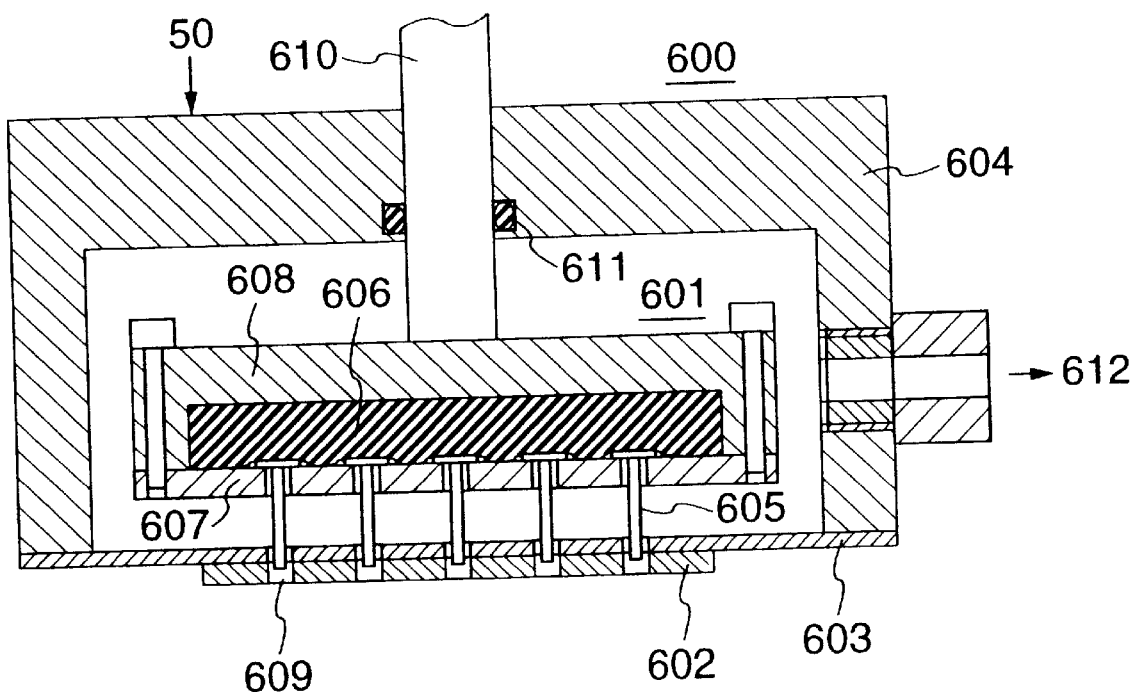
FIG. 13 is a cross-sectional view showing a second embodiment of an arraying jig.

As described above, the suction holding of the solder balls 61 at the indexing position A, the supply of the flux 70 to the solder balls 61 at the indexing position B, and the mounting of the solder balls 61 onto the package 75 at the indexing position C are effected simultaneously. Then, the cylinder 39 is operated to move the table 41 upward, and the servo motor 29 is operated to rotate the table 41 to index the same, and as shown in FIG. 12, the table 41 is once stopped when the arraying jigs are brought into opposed relation to the CCD cameras, respectively. The CCD camera 80 picks up an image of the lower surface of the arraying jig 50 which has vacuum picked up the solder balls 61, and the CCD camera 81 picks up an image of the lower surface of the arraying jig 50 carrying the solder balls 61 to which the flux has been supplied, and the CCD camera 82 picks up an image of the lower surface of the arraying jig 50 from which the solder balls 61 have been transferred to the package 75.

These image data are fed to the image processing device 84, and the image processing device 84 processes the image data so as to determine whether any solder ball 61 has failed to be vacuum picked up, whether any solder ball 61 has been disengaged from the arraying jig 50, and whether any solder ball 61 has failed to be mounted onto the package 75. After these are confirmed, the table 41 is again rotated for indexing to move the arraying jigs 50 into the positions A, B and C, respectively, as shown in FIG. 7.

By observing the array of solder balls 61 on the package 75 after the solder balls 61 are mounted onto the package 75, misregistration of the solder balls 61 and the failure in the mounting of the solder balls 61 can be checked.

Then, in the positioning device 202, the lift nozzle 77 is made open to the atmosphere, and also the cylinder 76 is operated to lower the lift nozzle 77, and the package 75, having the solder balls 61 mounted thereon, is placed on the carriage 74. In the positioning device 202, then, the carriage 74 is moved to locate the next package 75 at a position beneath the mounting position. Then, the cylinder 76 is operated to lift the lift nozzle 77 supplied with a vacuum pressure, and this lift nozzle 77 suction holds the package 75, and lifts this package 75 to the predetermined mounting position, and stands by. In the flux supply device 201, the stepping motor 65 is operated to rotate the reservoir 67 through a required angle, and the liquid film of flux 70 is moved to the position B, and the flux supply device 201 stands by in this condition.

In the above embodiment, the suction holding (or vacuum picking up) of the solder balls 61, the supply of the flux 70 to the solder balls 61, and the mounting (or transferring) of the solder balls 61 onto the package 75 can be carried out at the same time, and therefore the time required for one cycle can be made short (about 6 seconds). Therefore, the ball mounting operation can be rapidly effected. And besides, by checking each step, defects can be detected, and the high reliability can be secured.

As shown in FIG. 7, a waste box 90 may be provided. In this case, if one or more solder balls 61 are disengaged from the arraying jig 50 at the time of supplying the flux, the solder balls 61, remaining on the arraying jig 50, are discarded into the waste box 90, and fresh solder balls 61 are suction held by the arraying jig 50, and by doing so, the above step can be done again.

When the invention is applied to the case where a small amount of products are produced, for example, to provide samples, only one arraying jig 50 may be used. Three kinds of arraying jigs 50 may be provided, in which only one of the arraying jigs selected according to the need may be used.

Other embodiments of arraying jigs 50 will be described with reference to FIGS. 13 to 28.

An arraying jig 50 comprises a suction holding (vacuum picking-up) portion 600 for suction holding the solder balls, and a standing pin array device 601 for pushing out the solder balls.

The suction holding portion 600 comprises a mask 602 (made of an elastic material such as rubber) for suction holding the solder balls, a suction holding plate 603 adhesively holding the mask 602, and a suction holding block 604 to which the plate 603 is fixedly secured. The device 601 comprises pins 605, an elastic rubber member 606 elastically holding the pins 605, a plate 607 holding the pins 605 and the rubber member 606, and a block 608.

The suction holding portion 600 has a port 612 through which a vacuum pressure is applied, a guide hole 610 guiding the upward and downward sliding movement of the device 601, and an O-ring 611 for maintaining the vacuum. In the solder ball supply device 200 of FIG. 7, when a vacuum pressure is supplied to the port 612, the solder balls 61 are suction held in suction holding holes 609, respectively.

Figure 14:
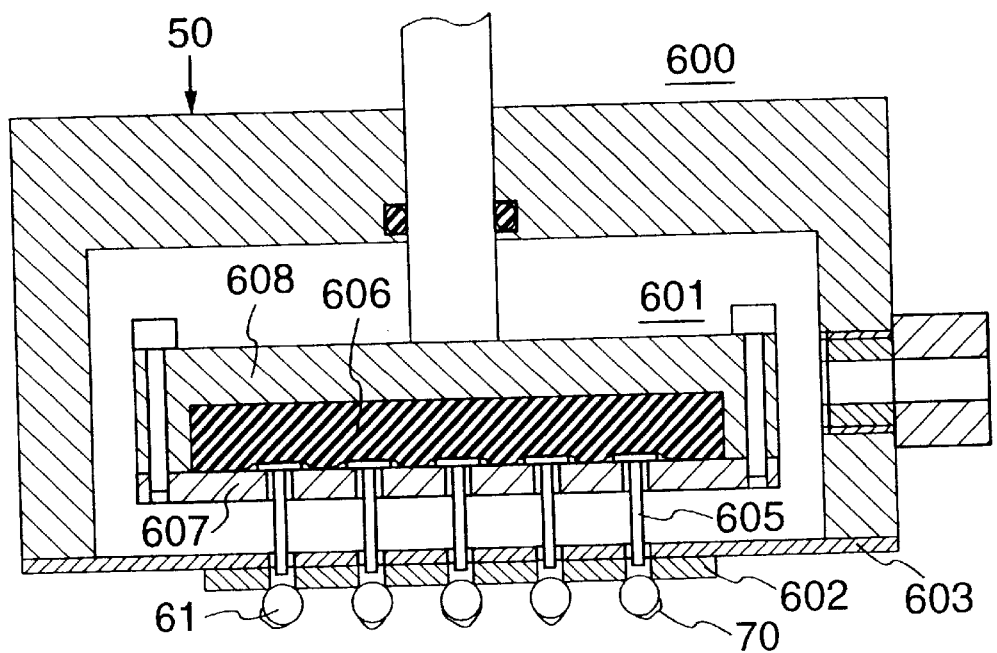
FIG. 14 is a process view showing a solder ball mounting step using the arraying jig of FIG. 13.
Figure 15:
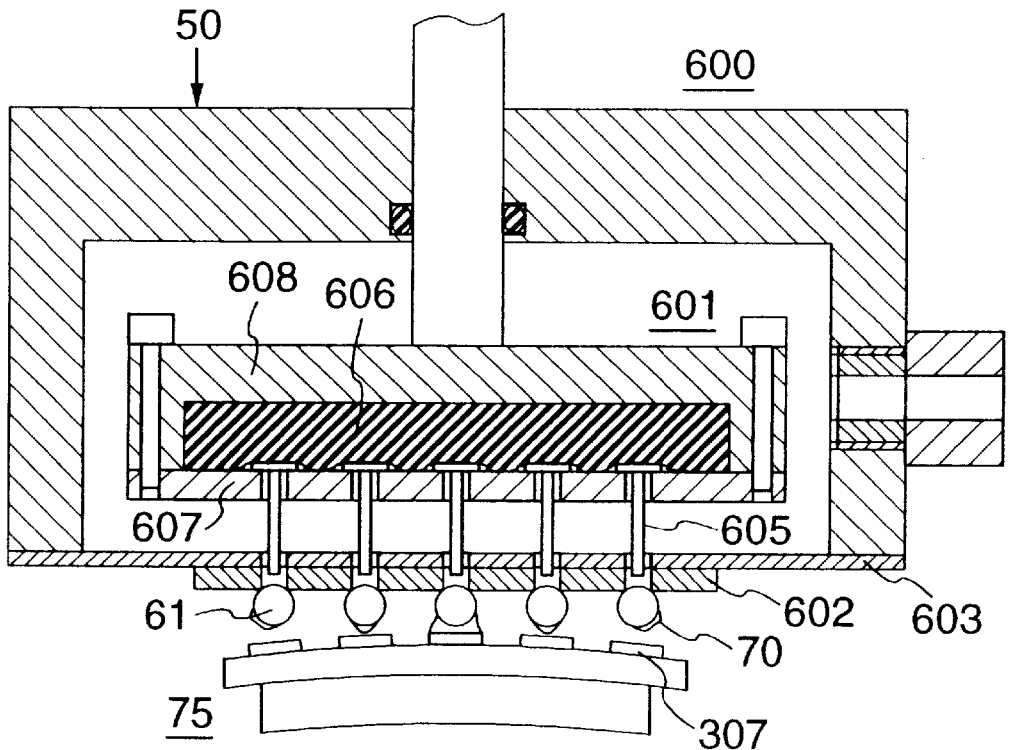
FIG. 15 is a process view showing the solder ball mounting step using the arraying jig of FIG. 13.
Figure 16:
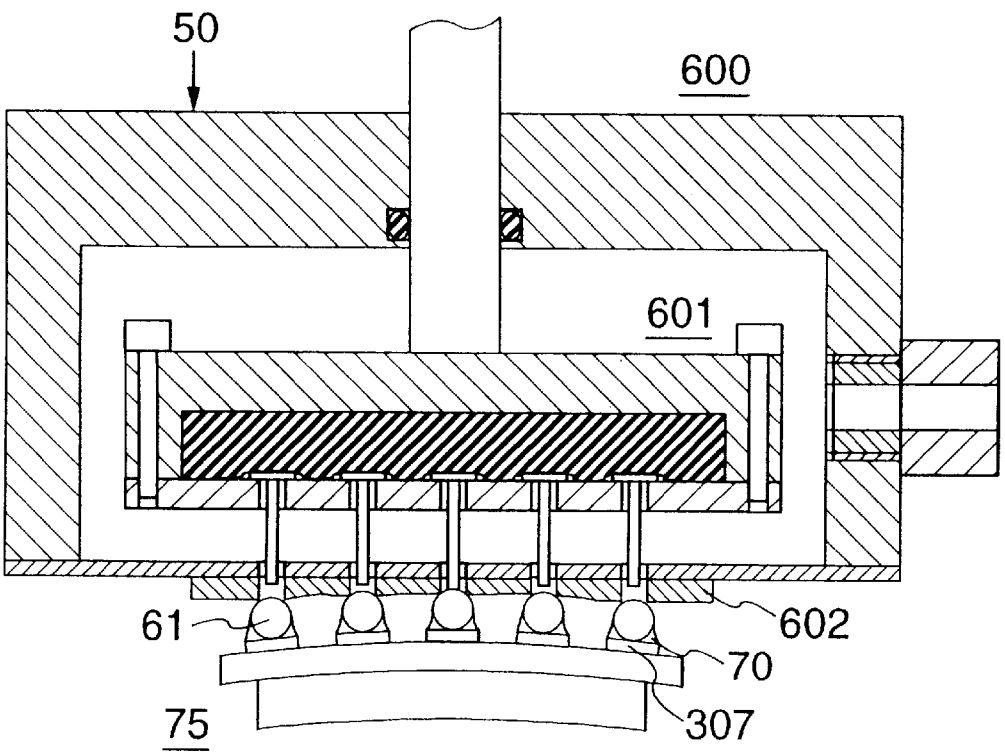
FIG. 16 is a process view showing the solder ball mounting step using the arraying jig of FIG. 13.

As shown in FIG. 14, the solder balls 61 are immersed in the liquid film of flux 70 in the flux supply device 201, so that the flux 70 adheres to the solder balls 61. Then, as shown in FIG. 15, the solder balls 61 are caused to approach the pads 307 of the package 75. At this time, if the package 75 is warped, the solder balls are first brought into contact with those pads 307 on the convex (or bulged) portion of the package 75. When the solder balls 61 further approaches the package 75, the mask 602 is deformed, and the solder balls 61 are pressed against the mask 602 in accordance with the warpage of the package 75, as shown in FIG. 16.

Figure 17:
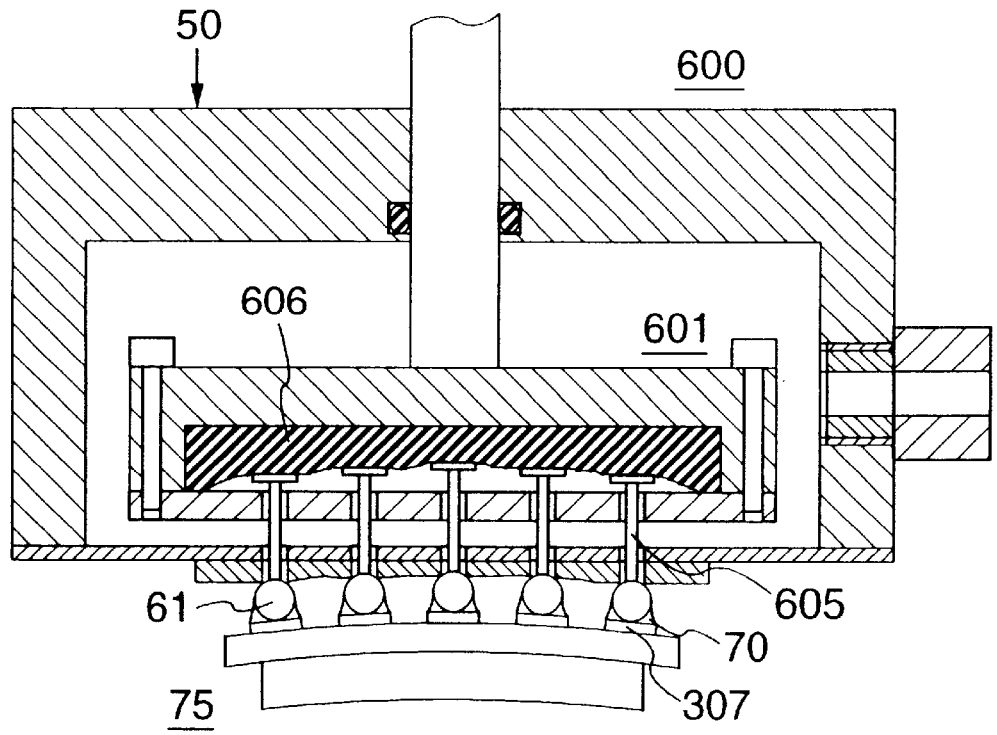
FIG. 17 is a process view showing the solder ball mounting step using the arraying jig of FIG. 13.
Figure 18:
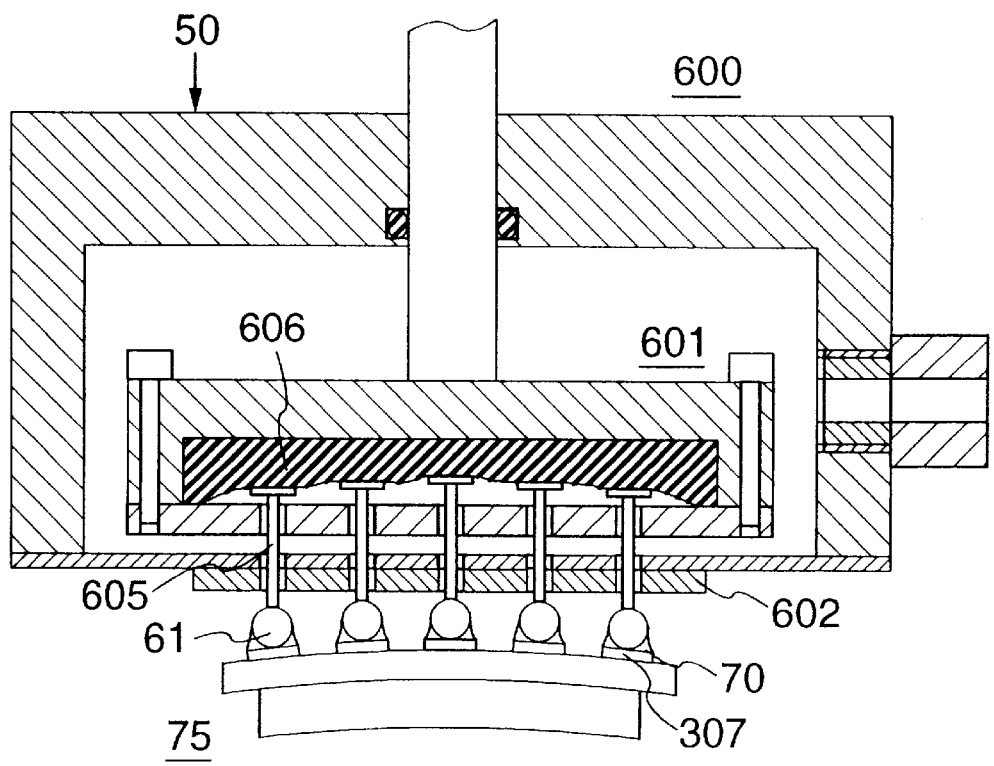
FIG. 18 is a process view showing the solder ball mounting step using the arraying jig of FIG. 13.
Figure 19:
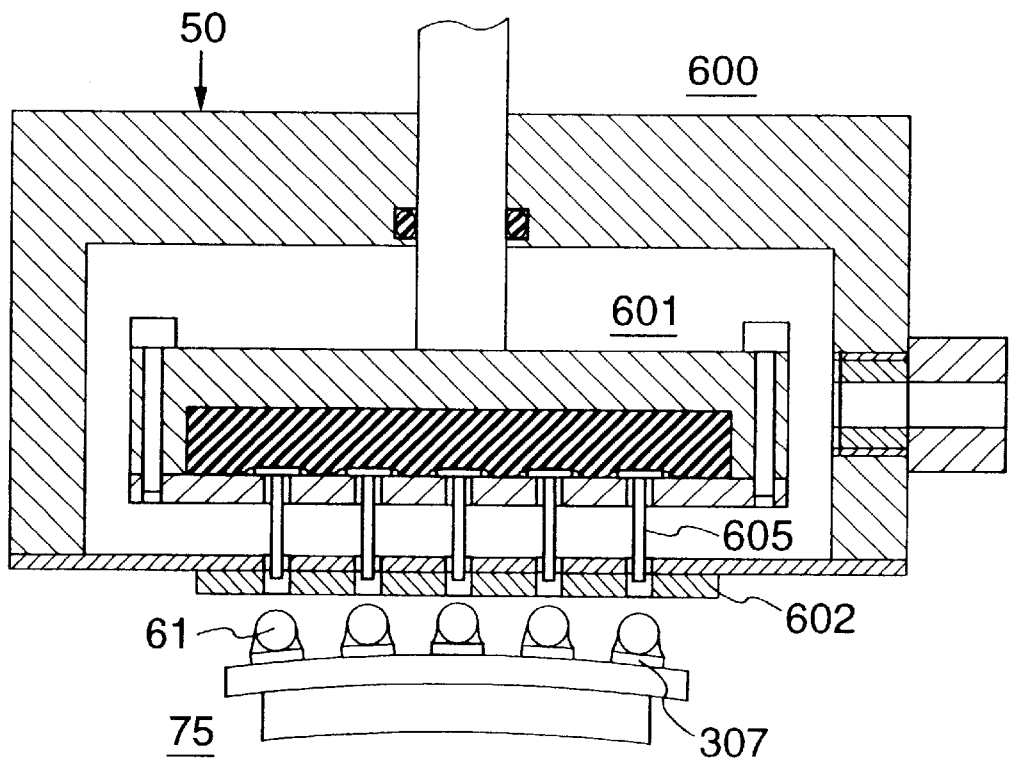
FIG. 19 is a process view showing the solder ball mounting step using the arraying jig of FIG. 13.

Then, as shown in FIG. 17, the device 601 descends, and the pins 605 push the solder balls 61, respectively. At this time, the elastic rubber member 606 is deformed by a reaction force applied from the solder balls 61. Then, as shown in FIG. 18, the suction holding portion 600 is moved upward, thereby separating the solder balls 61 from the mask 602. Finally, as shown in FIG. 19, the device 601 is moved upward. The solder balls 61 adhere to the package 75 by the adhesive force of the flux 70.

With the above method, the solder balls 61 can be positively mounted respectively on the pads 307 of the package 75 even if the package 75 is warped. Here, at the time of pressing the solder balls 61 against the package 75 as shown in FIG. 17, if each of the pin 605 is pressed against the associated solder ball 61 to such a degree that the pin 605 forms an impression (or indentation) in the solder ball 61, the portion of contact between the solder ball 61 and the pad 307 is slightly crushed, so that the contact area is increased, and as a result the contact of the solder ball 61 with the pad 307 becomes intimate, and this prevents the solder balls 61 from being displaced out of position during transport. And besides, the wetting for the pads 307 at the time of the reflow is enhanced, so that the reliability in the formation of the bumps is enhanced. Further, if spots of stain are present on the surface of the pads 307, there is still a good chance that the fused solder contacts those portions of the pad 307 which are not stained, because the contact surface is wide, and therefore the metal-to-metal bonding between the pad 307 and the solder ball 61 can be positively effected.

Figure 21:
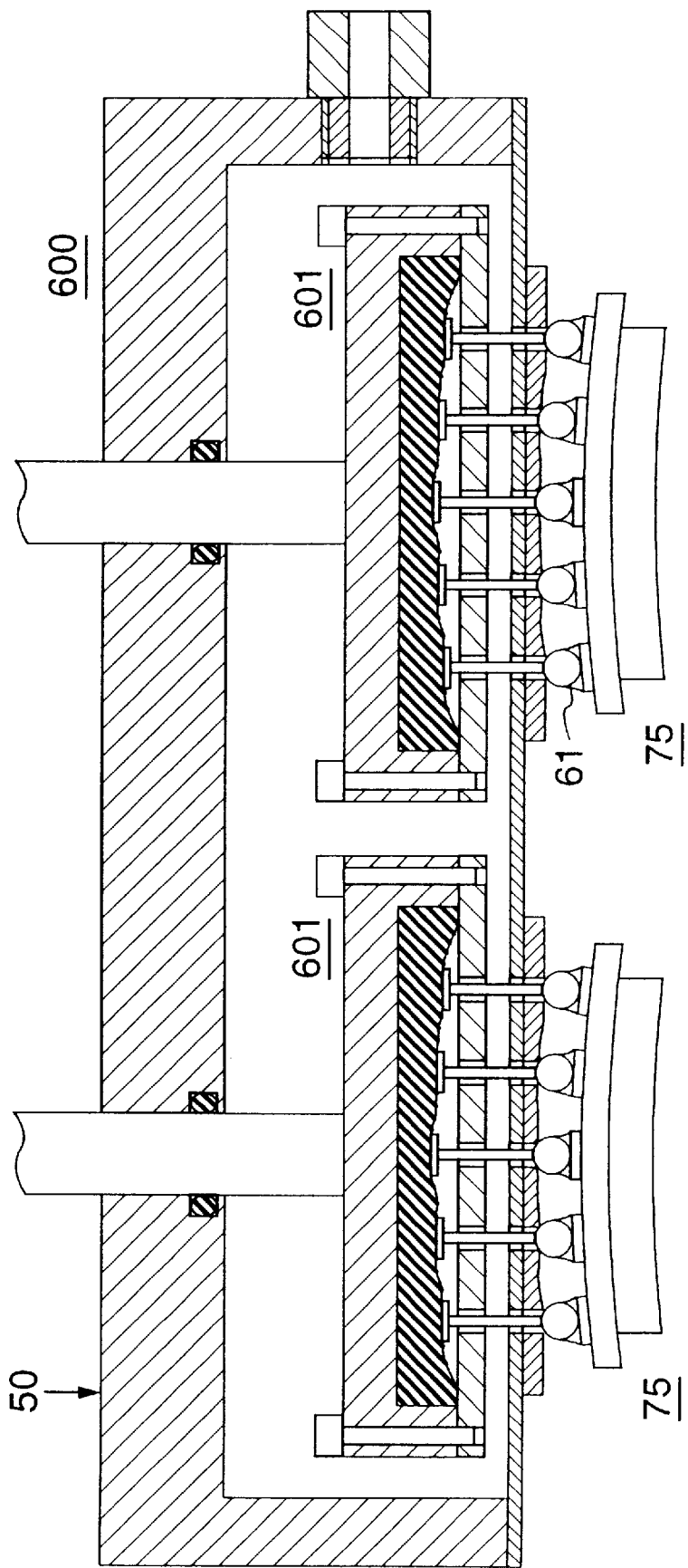
FIG. 21 is a cross-sectional view showing a fourth embodiment of an arraying jig.

FIG. 21 is a cross-sectional view showing a third embodiment of an arraying jig 50.

This arraying jig 50 comprises a suction holding portion 600 for suction holding the solder balls, and a plurality of standing pin array devices 601 for pushing out the solder balls. Arrays of solder balls 61 can be mounted respectively on a plurality of packages 75, or can be sequentially mounted on the plurality of packages 75, respectively. In this embodiment, two devices 601 are contained in the suction holding portion 600, and the solder balls 61 can be mounted on two packages 75 at the same time. In the case where the package 75 has a large size, and is much warped, a plurality of devices 601 may be so arranged that the solder balls 61 can be mounted on one package 75.

Figure 20:
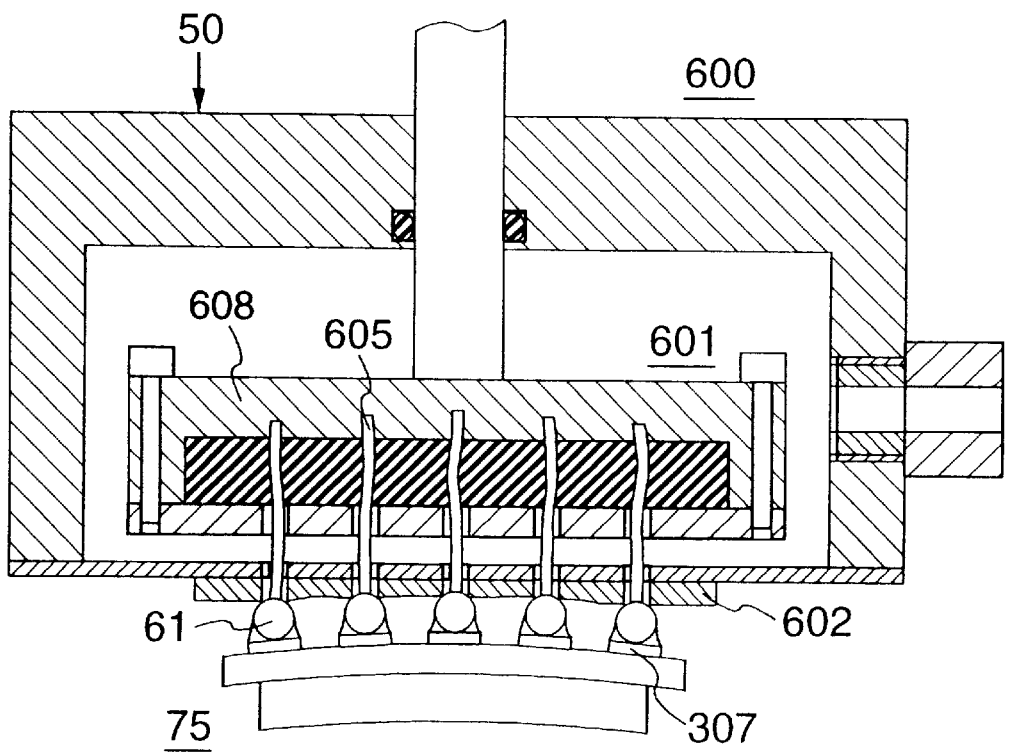
FIG. 20 is a cross-sectional view showing a third embodiment of an arraying jig.

FIG. 20 is a cross-sectional view showing a fourth embodiment of an arraying jig 50.

In this embodiment, pins 605, made of an elastic material, are embedded in a block 608. When a device 601 is lowered to press the solder balls 61 against the pads 307, respectively, the pins 605 are deformed so as to absorb the warpage of the package 75.

Figure 22:
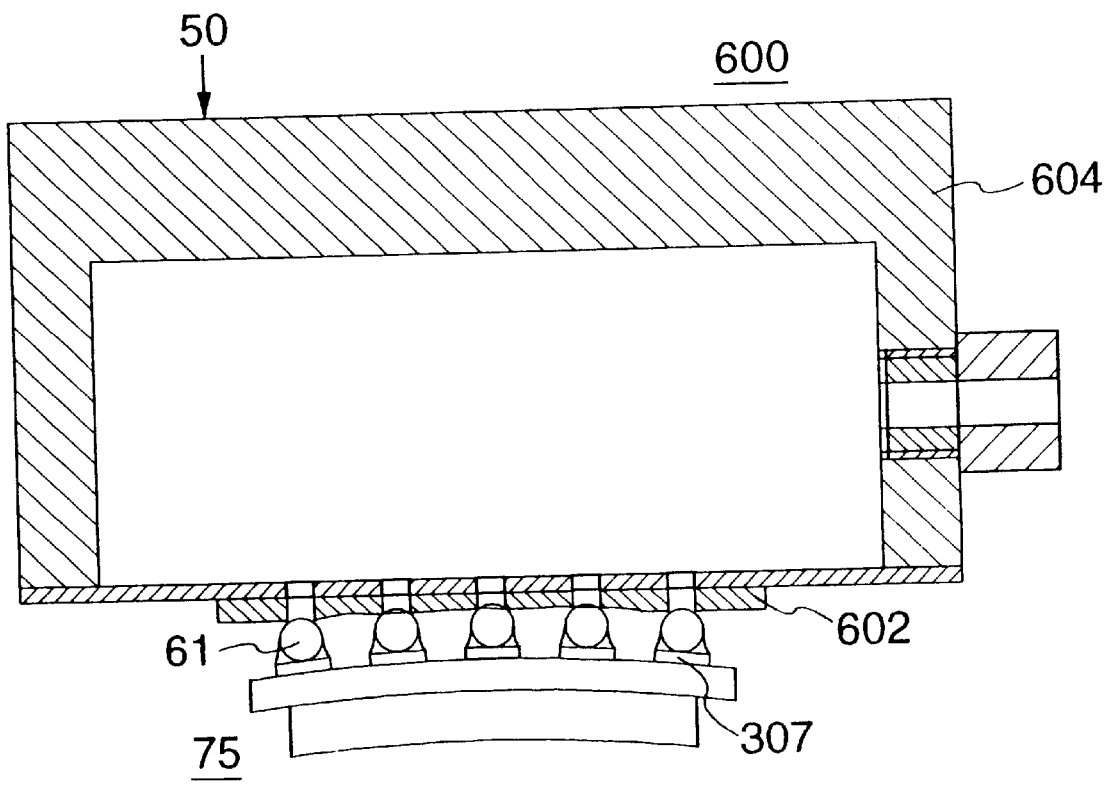
FIG. 22 is a cross-sectional view showing a fifth embodiment of an arraying jig.

FIG. 22 is a cross-sectional view showing a fifth embodiment of an arraying jig 50.

In this embodiment, the arraying jig 50 has only a suction holding portion 600 for suction holding the solder balls 61. The suction holding portion 600 comprises a block 604, and a mask 602 which is formed of an elastic material such as rubber, and is fixedly secured to a lower surface of the block 604.

The mask 602 holds the solder balls 61 supplied with the flux, and press the solder balls 61 against the pads 307 of the package 75, respectively. In this case, the mask 602 is elastically deformed in accordance with the warpage of the package 75, and the solder balls 61 are supplied to the pads 307, respectively.

At this time, even if any of those solder balls 61, corresponding respectively to those pads 307 provided at the peripheral (or marginal) portion of the package 75, is out of contact with the associated pad 307, and drops from the mask 602, the flux 70 at the lower surface of the solder ball 61 contacts the pad 307 since the distance between the lower surface of the solder ball 61 and the pad 307 is small, and therefore this solder ball 61 will not be much misregistered with the pad 307.

Therefore, this construction is effective for the case where the pads 307 have a large size, and the precision of mounting of the solder balls is not so severe.

Figure 23:
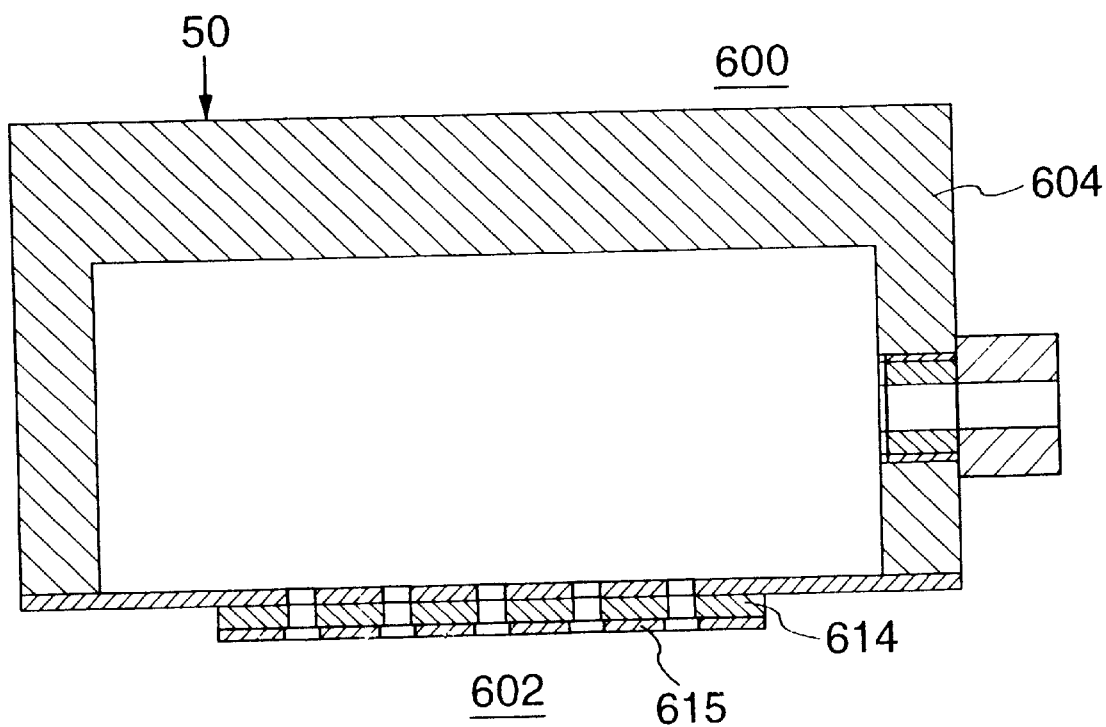
FIG. 23 is a cross-sectional view showing a sixth embodiment of an arraying jig.

FIG. 23 is a cross-sectional view showing a sixth embodiment of an arraying jig 50.

In this embodiment, the arraying jig 50 has only a suction holding portion 600 for suction holding the solder balls 61. The suction holding portion 600 comprises a mask 602, and a block 604. The mask 602 is constituted by a rubber plate 614 and a resin film 615 bonded to the rubber plate 614. Holes are formed through the rubber plate 614 with low precision, and holes are formed through the resin film 615 with high precision by a laser or the like. The mask 602 is inexpensive, and the precision of formation of the holes in the mask 602 is high as a whole, and its solvent-resistance is high.

Figure 24:
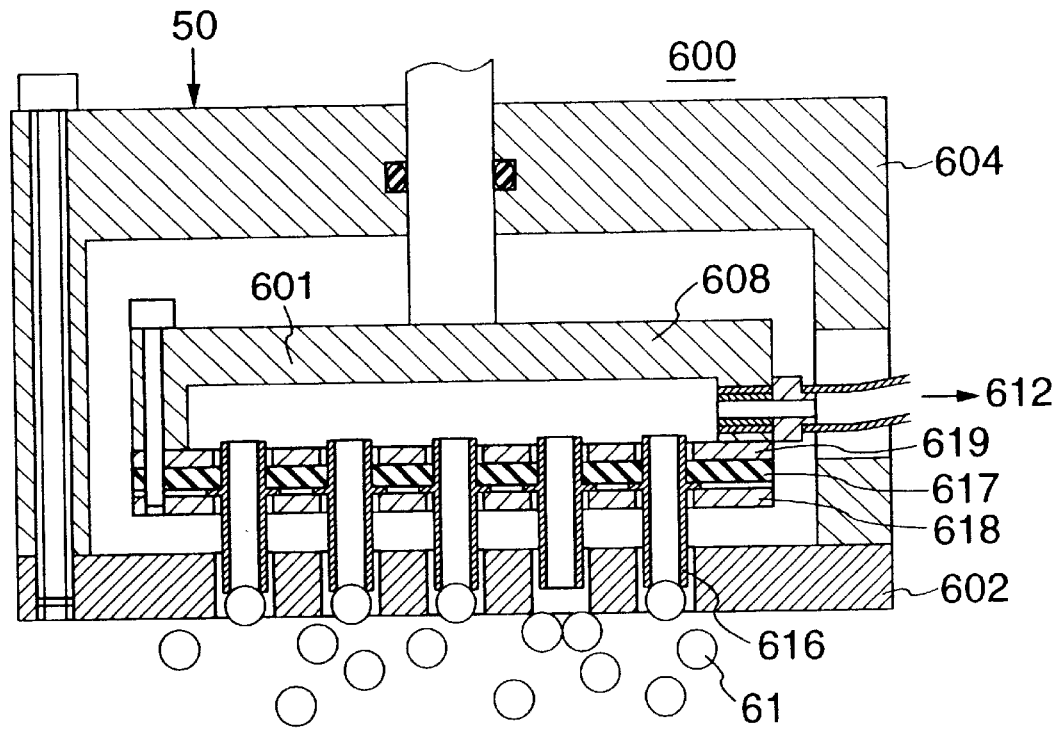
FIG. 24 is a cross-sectional view showing a seventh embodiment of an arraying jig.

A seventh embodiment of an arraying jig 50 shown in FIG. 24 comprises a suction holding portion 600, and a standing pin array device 601 having pipe-like pins 616. The suction holding portion 600 comprises a mask 602 and a block 604, and holes, having a diameter slightly larger than the outer diameter of the pins 616 and the diameter of the solder balls 61, are formed through the mask 602. Flanges of the pins 616 are held between plates 618 and 619 through a rubber plate 617, thereby forming a standing pin array plate having rigidity. This plate is fixed to the block 608 to form the device 601. In this condition, the distal end of each pin 616 is spaced inwardly from the lower surface of the mask 602 by a distance corresponding to about a half of the diameter of the solder ball 61.

In this embodiment, when the solder balls 61 are to be vacuum picked up from the solder ball supply device 200, there is a reduced possibility that a plurality of solder balls 61 are suction held in the outer open end of the hole in the mask 602 as shown in FIG. 24, since the solder balls 61 are vacuum picked up by the respective pins 616 whose outer open ends are disposed in the mask 602.

Even if a plurality of the solder balls 61 are thus vacuum picked up, the solder ball 61 subsequently blown up impinges on the vacuum picked up solder ball 61, so that the extra solder ball 61 is removed from the outer open end of the hole in the mask 602. Therefore, the solder balls 61 are rapidly vacuum picked up by the pins 616, respectively.

Figure 25:
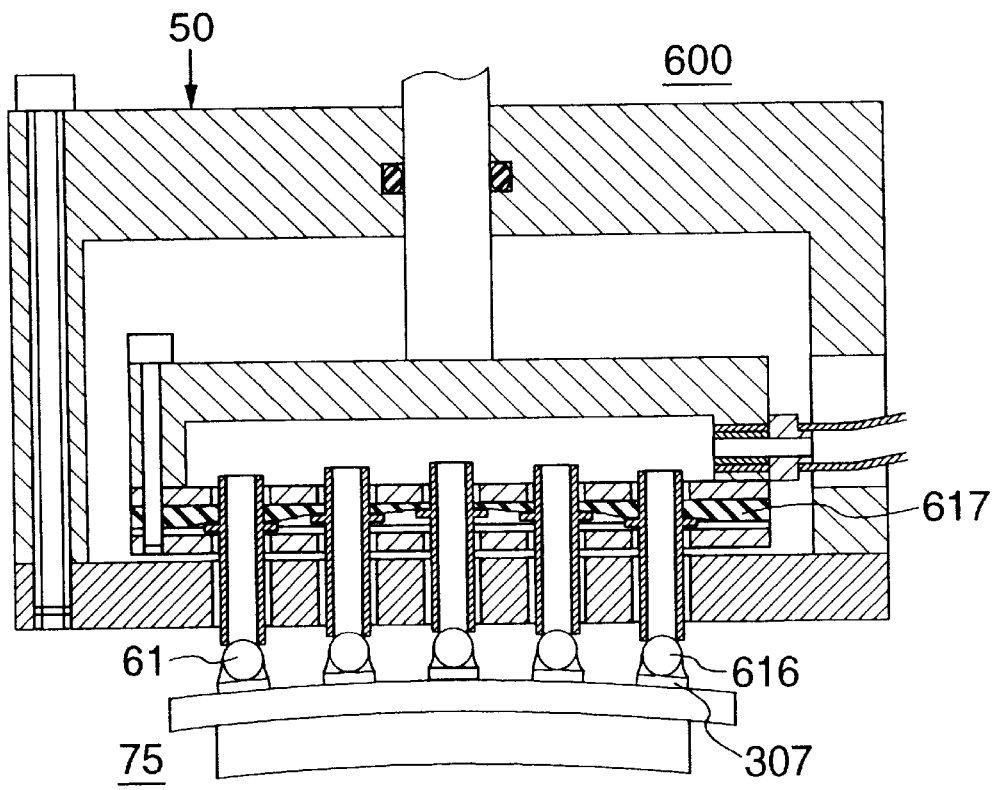
FIG. 25 is view explanatory of the operation of the arraying jig of FIG. 24.

When the solder balls 61 thus vacuum picked up are mounted respectively onto the pads 307 of the warped package 75, the rubber plate 617 is deformed in accordance with the warpage of the package 75 as shown in FIG. 25, so that all of the solder balls 61 suction held by the pins 616 are pressed against the pads 307, respectively, and thus the mounting of the solder balls can be effected positively.

Figure 26:
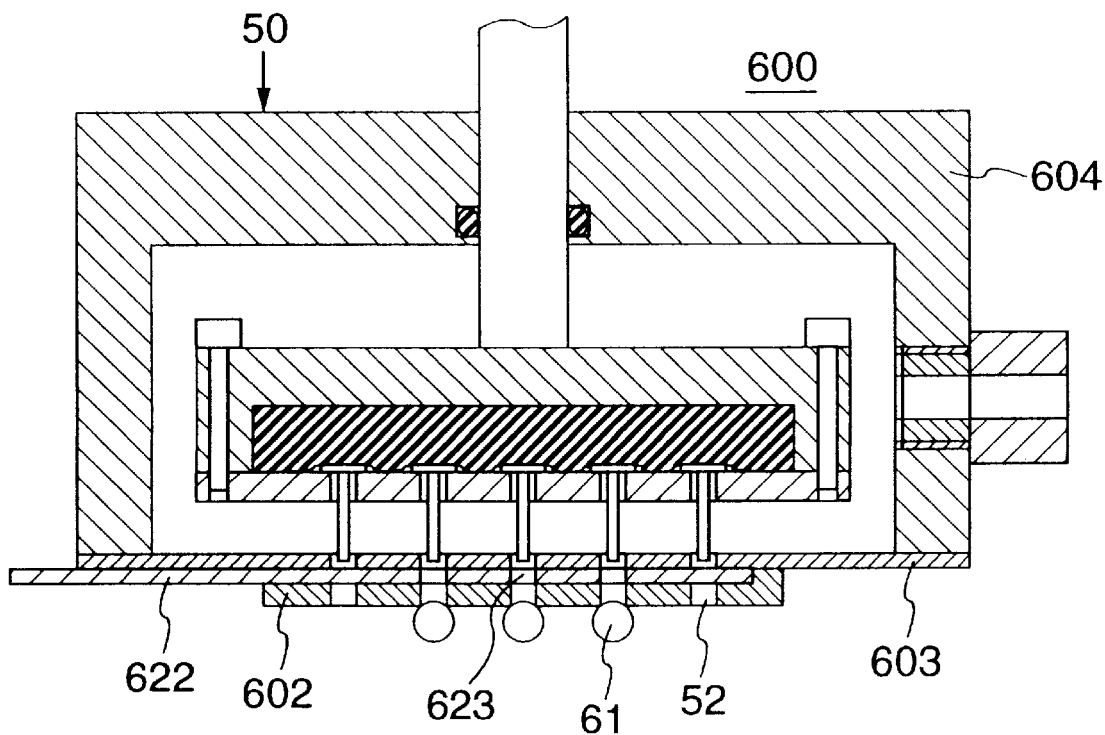
FIG. 26 is a cross-sectional view showing an eighth embodiment of an arraying jig.

In an eighth embodiment of an arraying jig 50 shown in FIG. 26, a screen plate 622, having through holes 623 formed therethrough in a predetermined pattern, is detachably provided between a plate 603, fixedly secured to a lower surface of a block 604, and a mask 602 fixedly secured to a lower surface of the plate 603.

With this construction, the solder balls 61 are vacuum picked up only by those of holes in the mask 602 which are determined by the hole pattern of the screen plate 622.

Figure 27:
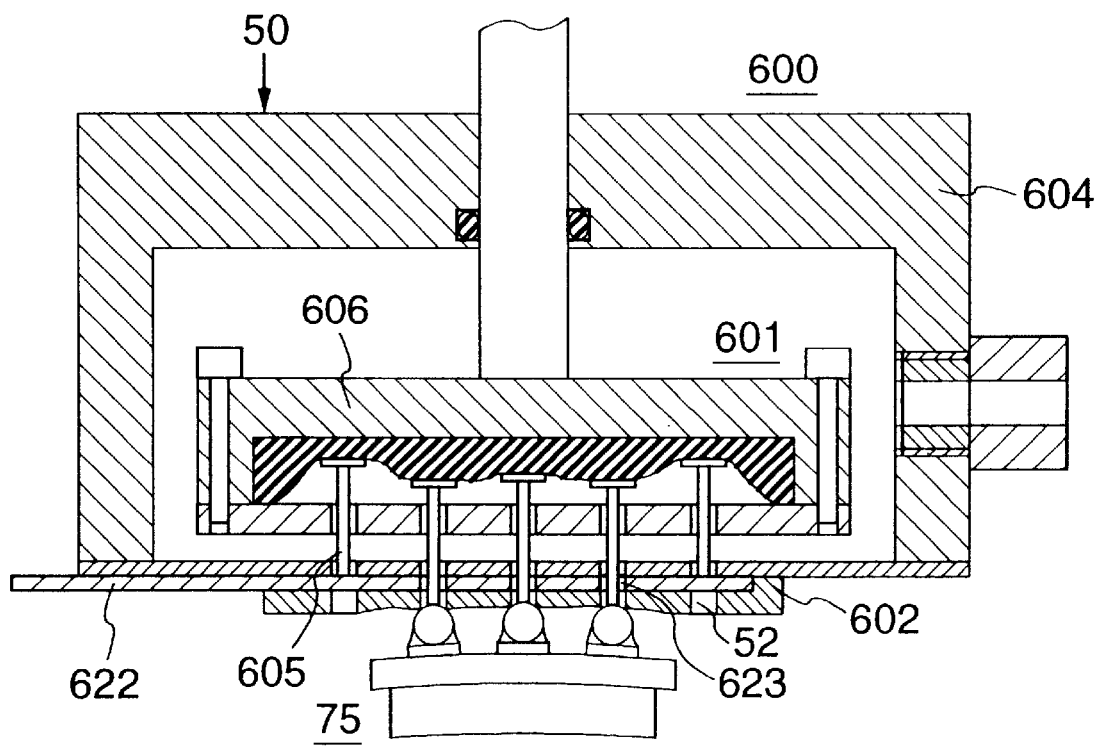
FIG. 27 is a view explanatory of the operation of the arraying jig of FIG. 26.

When mounting the solder balls 61 onto the package 75, those pins 605, corresponding to those portions of the screen plate 622 having no hole 623, strike against the screen plate 622 as shown in FIG. 27, and hence will not reach the mask 602.

Merely by exchanging the screen plate 622, various kinds of packages 75 different in the number of the pads can be handled.

As described above, the solder balls 61 can be positively mounted even onto the warped package 75 by the arraying jig 50, and besides the contact of the solder balls with the respective pads 307 is intimate, and therefore the improper wetting at the time of the reflow can be reduced. Further, different kinds of packages 75 can be handled by the use of the screen plate 622.

Figure 28:
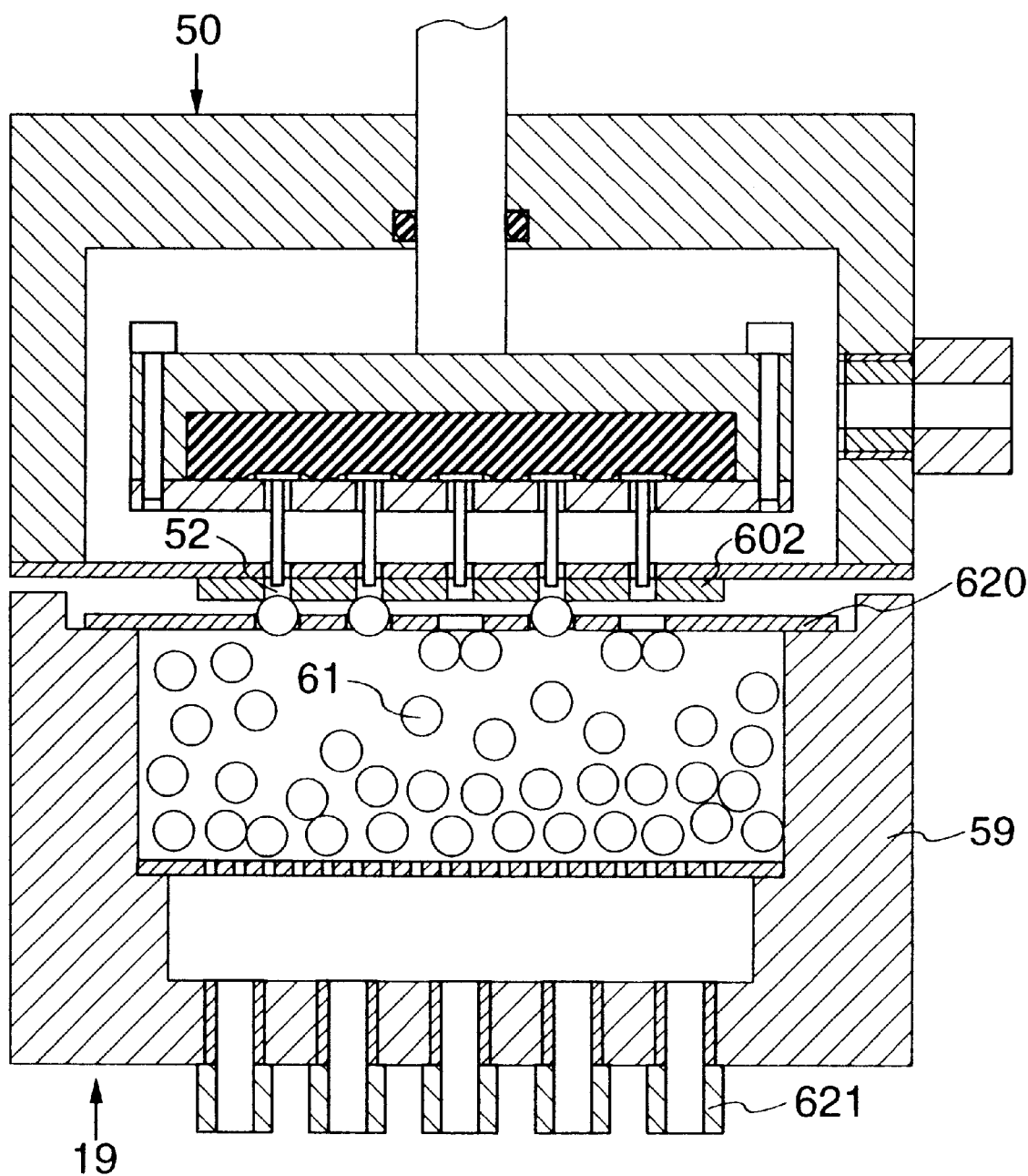
FIG. 28 is a cross-sectional view showing a second embodiment of a solder ball supply device.

In another embodiment of a solder ball supply device 200 shown in FIG. 28, a screen 620, having through holes formed therethrough, is provided at an open top in a solder ball hopper 59, and these through holes have a diameter larger than the diameter of the solder ball 61 but smaller than a value twice the diameter of the solder ball 61.

The solder balls 61, blown up by air flows supplied from air pipes 621, intrude into the through holes in the screen 620, and are vacuum picked up by a mask 602. At this time, a plurality of solder balls 61 will not intrude into one through hole, and therefore the solder balls 61 can be positively vacuum picked up by the mask 602. The solder ball 61 is vacuum picked up in such a manner that more a half thereof is received in the through hole in the screen 620, and therefore this solder ball will not drop from the through hole even if the subsequently-blown up solder ball 61 impinges on this solder ball.

Even if two solder balls 61 are simultaneously suction held in the through hole in the screen 620, these solder balls 61 are easily disengaged from the through hole upon impingement of the subsequently-blown up solder ball thereon, since its suction force is small. Therefore, the solder balls 61 are suction held respectively in the through holes in the screen 620.

A method of arraying the solder balls suction held by the arraying jig will be described with reference to FIGS. 29 to 32.

A brush 503, spaced a predetermined distance from the lower surface of the arraying jig 50 suction holding the solder balls 61, is moved. At this time, if two solder balls are suction held in any suction hole, the amount of projection of these solder balls from the lower surface of the arraying jig is larger than that of the other suction held solder balls, and therefore the two solder balls are pushed by the distal end of the brush 503, and one of the two solder balls pushes the other solder ball aside, and is completely suction held in the suction hole in the arraying jig. In this manner, the solder balls 61 can be arrayed on the arraying jig 50.

Figure 29:
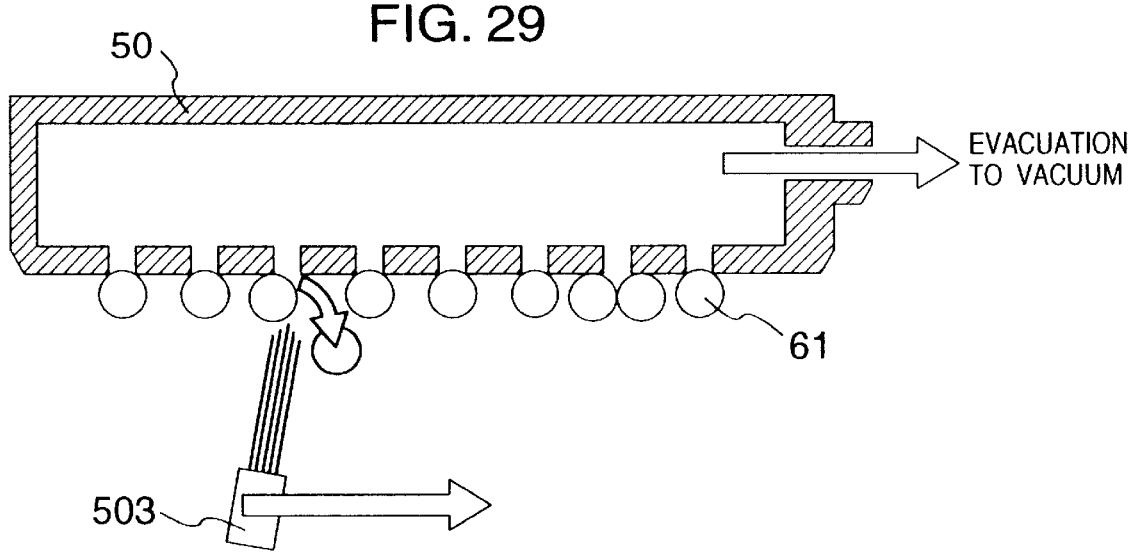
FIG. 29 is a view explanatory of a method of arraying solder balls relative to the arraying jig.
Figure 30:
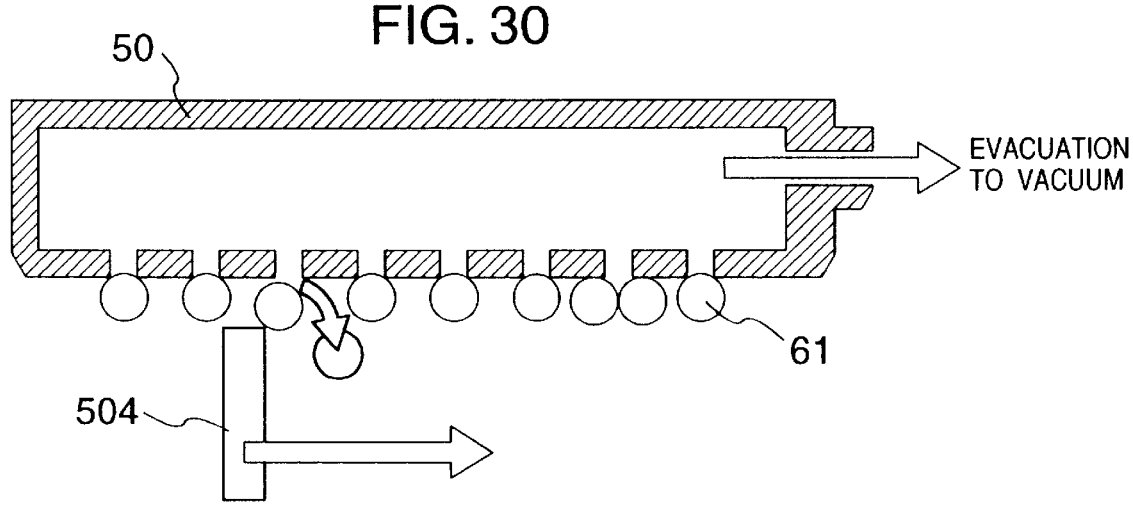
FIG. 30 is a view explanatory of a method of arraying solder balls relative to the arraying jig.

As shown in FIG. 30, instead of the brush 503, a blade 504 may be used, and in this case, also, the solder balls 61 can be arrayed on the arraying jig 50 as in the case of FIG. 29.

Figure 31:
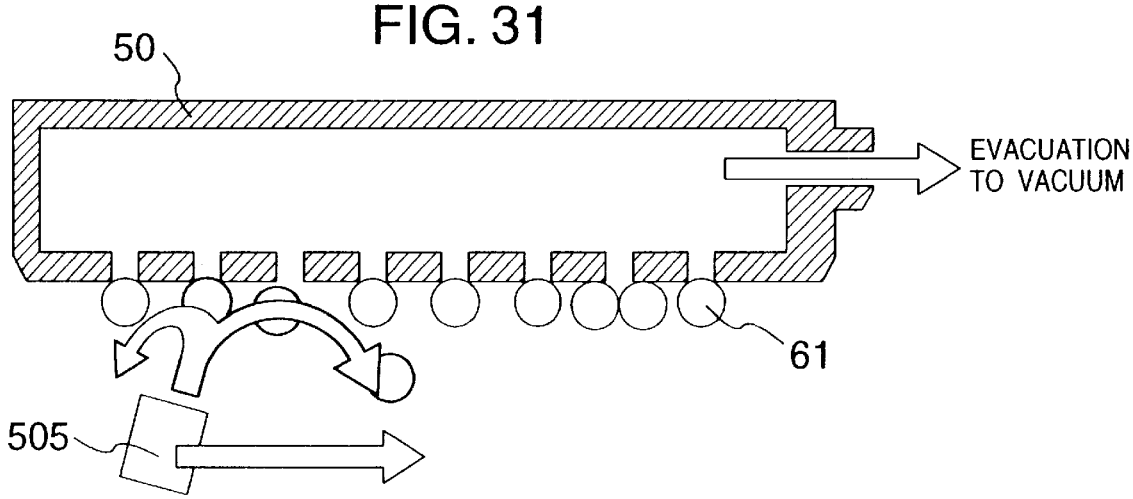
FIG. 31 is a view explanatory of a method of arraying solder balls relative to the arraying jig.

In an embodiment shown in FIG. 31, there is used an air nozzle 505 having an air injection port substantially equal in width to the arraying jig 50. The air nozzle 505 is moved while blowing or injecting the air from the air nozzle 505 to the solder balls 61, so that the solder balls 61 can be arrayed on the arraying jig 50.

Figure 32:
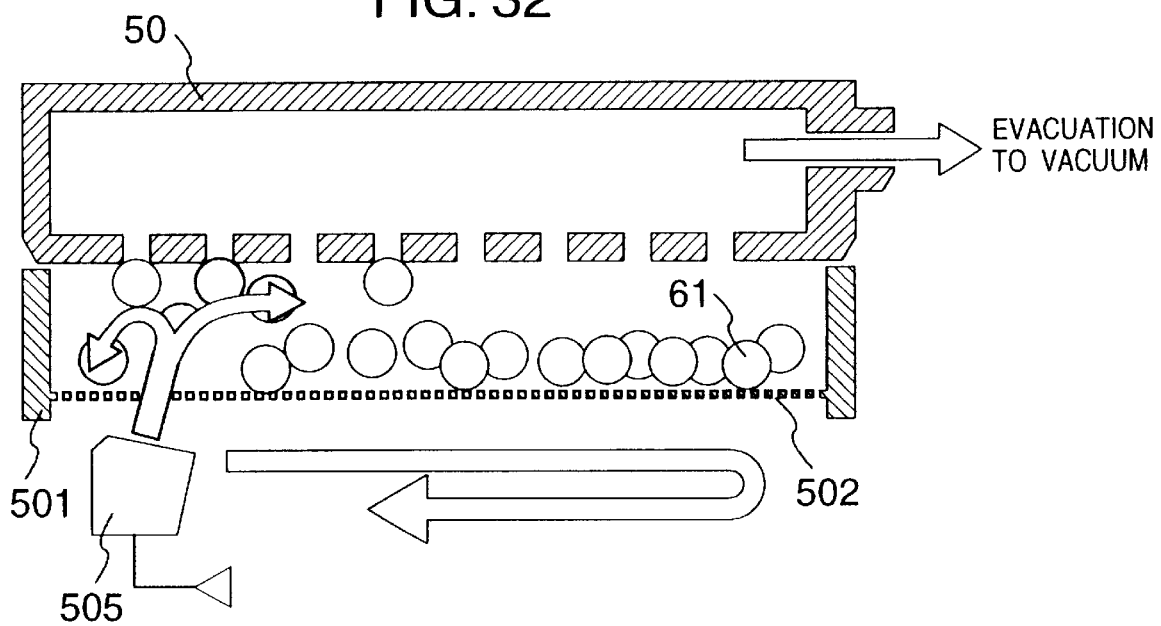
FIG. 32 is a view explanatory of a method of arraying solder balls relative to the arraying jig.

In an embodiment shown in FIG. 32, a bottom of a solder ball container 501 is constituted by a net 502 whose mesh is smaller than the diameter of the solder ball 61. An air nozzle 505 has an air injection port substantially equal in width to the arraying jig 50.

The air nozzle 505 is moved while blowing or injecting the air from the air injection port, so that the solder balls 60 are blown up to the solder ball suction holes in the arraying jig sequentially from one end of the arraying jig 50. Therefore, the adjustment of the blow-up of the solder balls can be made easier as compared with the case where the solder balls 61 are blown up in a generally common plane, and therefore the supply of the solder balls 61 to the arraying jig 50, as well as the vacuum picking-up of the solder balls 61 by the arraying jig 50, can be effected positively.

Next, other embodiments of flux supply devices will be described with reference to FIGS. 33 to 42.

Figure 33:
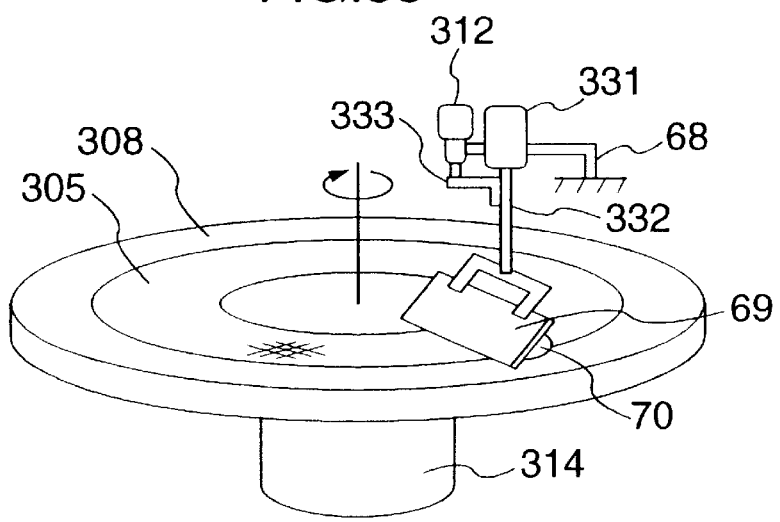
FIG. 33 is a perspective view showing a second embodiment of a flux supply device.

In FIG. 33, a disk 308 is supported on a rotation shaft of a motor 314. A bearing 331 is supported on a stand 68. A shaft 332 is movably supported on the bearing 331. A moving mechanism 312 comprises, for example, a micrometer head, and is fixedly mounted on the stand 68. A moving portion of the moving mechanism 312 is connected to the shaft 332 through a bracket 333. A squeegee 69 is fixedly secured to the shaft 332.

Figure 34:
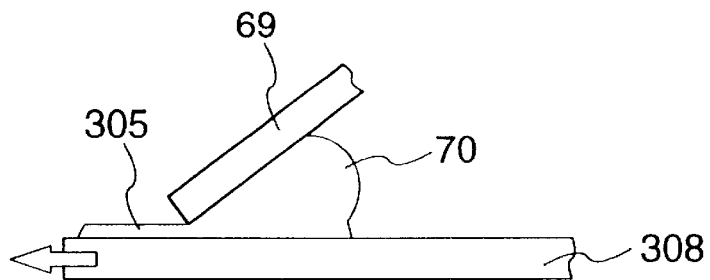
FIG. 34 is a view showing a process in the case of using the flux supply device shown in FIG. 33.

The distance between the disk 308 and the squeegee 69 is set to a predetermined value by the moving mechanism 312, and the flux 70 is supplied between the squeegee 69 and the disk 308. Then, when the motor 314 is operated to rotate the disk 308, the flux 70 is spread over the disk 308, so that a liquid film 305 of the flux 70, having a thickness corresponding to the distance between the disk 308 and the squeegee 69, is formed on the disk 308, as shown in FIG. 34. When the required liquid film 305 is formed, the disk 308 is stopped.

Figure 35:
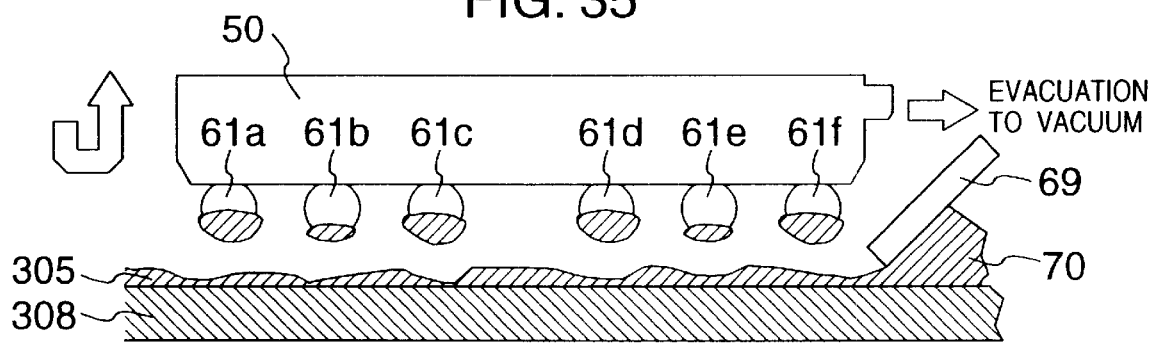
FIG. 35 is a view showing the process in the case of using the flux supply device shown in FIG. 33.
Figure 36:
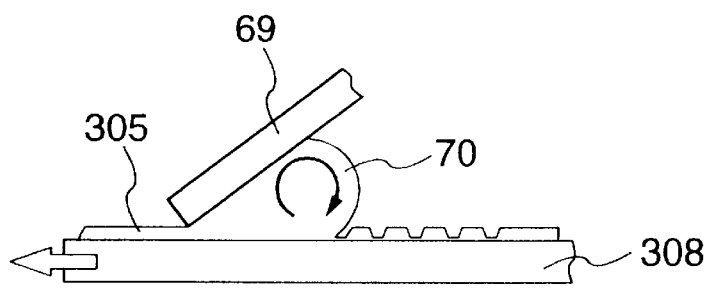
FIG. 36 is a view showing the process in the case of using the flux supply device shown in FIG. 33.

Then, as shown in FIG. 35, the solder balls 61a to 61f, suction held by the arraying jig 50, are immersed in this liquid film 305, thereby supplying the flux 70 to the solder balls 61a to 61f. As a result, the surface of the liquid film 305, from which part of the flux 70, adhering to the solder balls 61, is removed, becomes rugged.

Therefore, as shown in FIG. 36, the disk 308 is again rotated to flatten the rugged surface of the liquid film 305.

In this embodiment, the disk 308, on which the flux 70 is coated and spread, also serves as a resistance plate for applying a fluid resistance to the flux 70. Therefore, the structure of that portion of the flux supply device which holds the flux 70 has a plate-like configuration, and is simple. Therefore, the exchange of the flux and the maintenance of the apparatus are easy.

Figure 37:
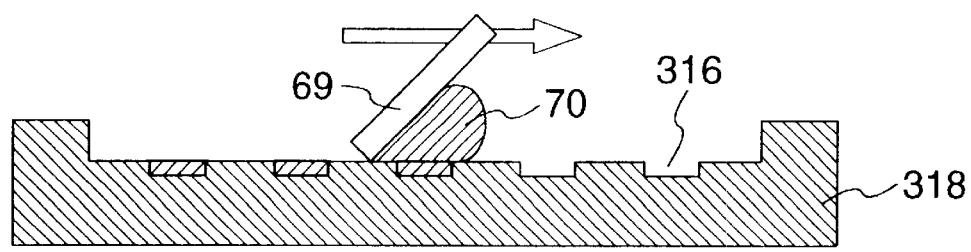
FIG. 37 is a cross-sectional view showing a third embodiment of a flux supply device.
Figure 38:
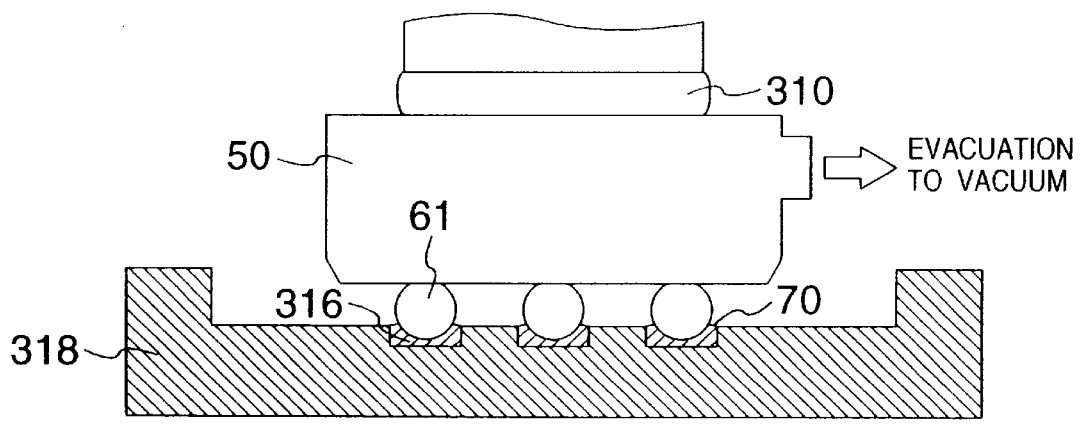
FIG. 38 is a view showing a process in the case of using the flux supply device shown in FIG. 37.

In FIG. 37 showing a third embodiment of a flux supply device, recesses 316 are formed in a flux reservoir 318 at predetermined intervals. The flux 70, supplied to the flux reservoir 318, is spread by a squeegee 69 to fill the flux 70 in the recesses 316. Then, as shown in FIG. 38, the solder balls 61, suction held by the arraying jig 50, are immersed a predetermined depth into the flux 70 filled in the recesses 316.

Figure 39:
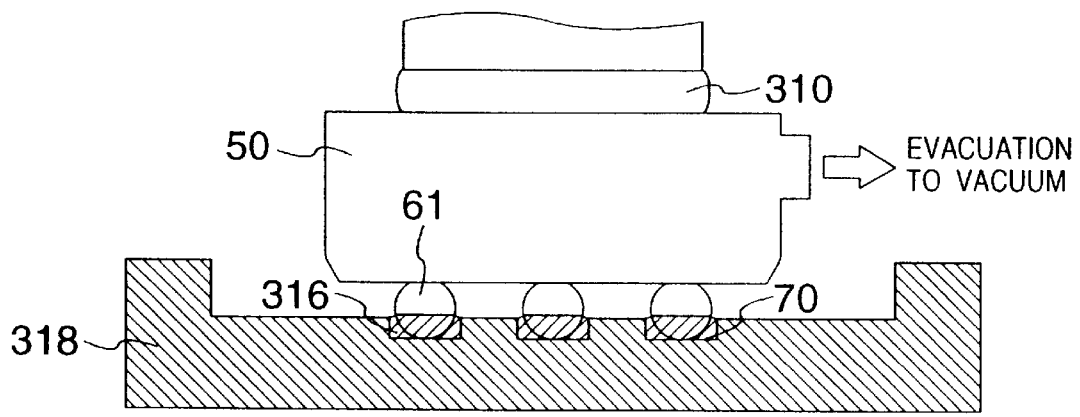
FIG. 39 is a view showing the process in the case of using the flux supply device shown in FIG. 37.

As shown in FIG. 39, the solder balls 61 may be brought into contact with the bottoms of the recesses 316, respectively. If there is a fear that the solder balls 61 are disengaged from the arraying jig 50, or are damaged by this contact, those surfaces for contact with the solder balls 61 may be formed by an elastic material such as silicone rubber so that such disengagement and damage can be prevented.

With this construction, the amount of supply of the flux 70 to the solder balls 61 can be made uniform.

Figure 40:
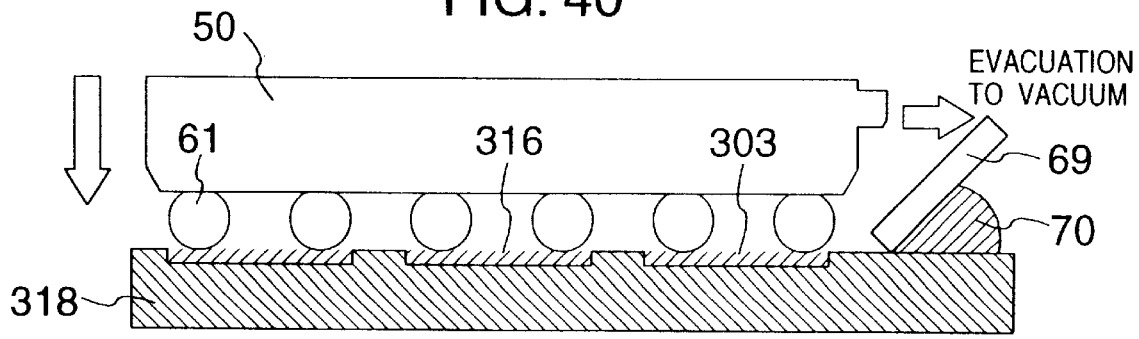
FIG. 40 is a cross-sectional view showing a modified form of the third embodiment of the flux supply device.
Figure 41:
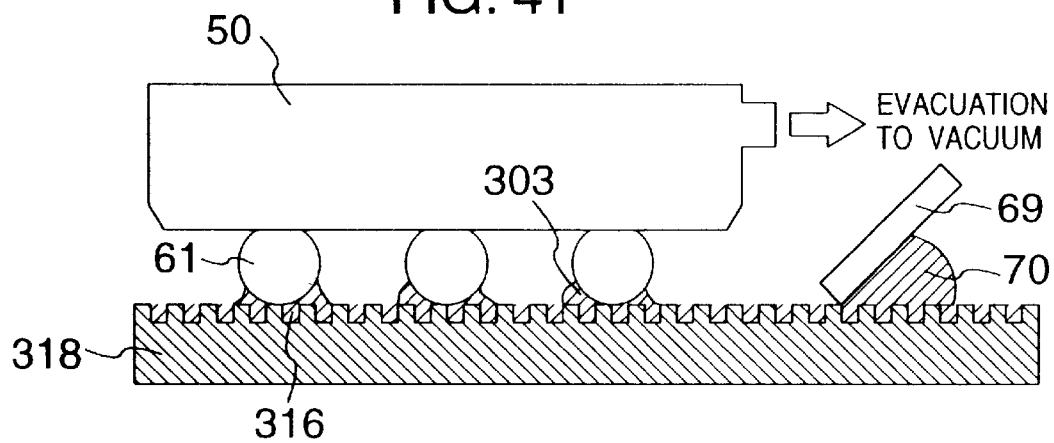
FIG. 41 is a cross-sectional view showing a modified form of the third embodiment of the flux supply device.

As shown in FIG. 40, a plurality of solder balls 316 may correspond to one recess 316. Also, as shown in FIG. 41, a plurality of recesses 316 may correspond to one solder balls 61. Thus, it is not always necessary that one solder ball 61 should correspond to one recess 316.

Figure 42:
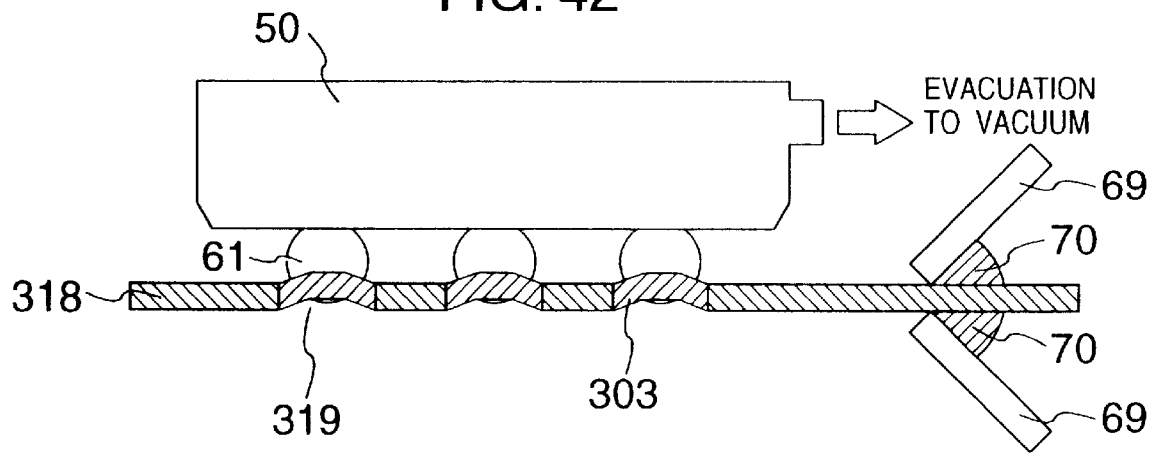
FIG. 42 is a cross-sectional view showing fourth embodiment of a flux supply device.

In FIG. 42 showing a fourth embodiment of a flux supply device, through holes 336 are formed through a plate 335 at predetermined intervals.

Squeegees 69, provided respectively on opposite sides of the plate 335, are moved, so that the flux 70 is filled in the through holes 336. The solder balls 61, suction held by the arraying jig 50, are introduced respectively into the through holes 336, thereby supplying the flux 70 to the solder balls 61.

Figure 43:
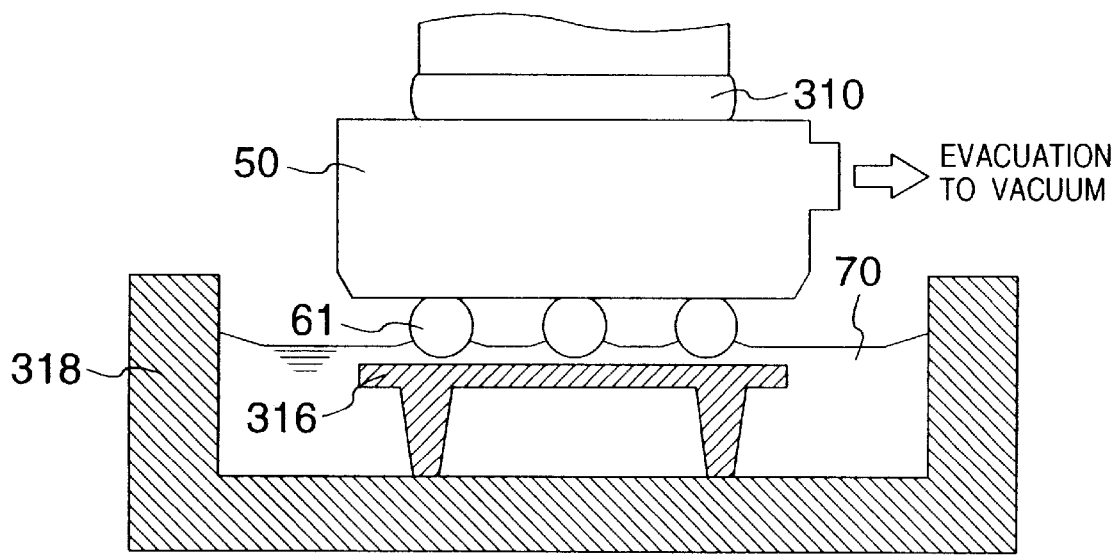
FIG. 43 is a cross-sectional view showing a fifth embodiment of a flux supply device.

A fifth embodiment of a flux supply device, shown in FIG. 43, comprises a flux reservoir 318, and a wetting resistance plate 316. An elastic member 310 serves as a cushioning member which prevents the solder balls 61 from being disengaged from the arraying jig 50 as a result of application of a load to the solder balls 61 upon contact of the solder balls 61 with the resistance plate 316 at the time of immersing the solder balls 61 in the flux 70.

In this construction, the lower ends of the solder balls 61, suction held by the arraying jig 50, are immersed in the flux 70, thereby supplying the flux 70 to the solder balls 61. Thanks to the provision of the wetting resistance plate 316, the flux 70 is prevented from rising to such an extent as to wet the arraying jig 50 at the time of supplying the flux 70 to the solder balls 61. Therefore, even if the conventional flux is used, the arraying jig 50 will not be contaminated. As a result, advantageously, the arraying jig 50 is kept clean, and the solder bump forming apparatus can be operated stably.

FIG. 44 shows the wetting prevention effect achieved by the resistance plate 316.

These data were measured, using eutectic solder balls, having a diameter of 0.76 mm, and a flux having the viscosity of 8000 cP. An arraying jig used was made of stainless steel, and its solder ball suction-holding portions had a projected shape. A resistance plate 316 used was also made of stainless steel.

When the distance between the liquid surface of the flux and the upper surface of the resistance plate 316 is 6 mm, the flux 70 rises to wet the arraying jig 50 upon slight contact of the solder balls 61 with the flux liquid surface, and contaminates the arraying jig 50.

However, when the distance between the flux liquid surface and the upper surface of the resistance plate 316 is 0.4 mm, the flux 70 rises to an extent slightly short of the arraying jig 50.

When the distance between the flux liquid surface and the upper surface of the resistance plate 316 is 0.2 mm, the rising of the flux 70 is further reduced, and is kept to a safe not causing the contamination of the arraying jig 50. And, various disadvantages, caused by the contamination of the arraying jig 50 by the flux 70, are overcome.

Thus, when using the resistance plate 316, the contamination of the arraying jig 50 can be prevented by keeping the distance between the flux liquid surface and the resistance plate 316 to not more than 50% of the diameter of the solder ball 61.

In a condition in which the solder balls 61 are immersed in the flux 70, if the distance between the flux liquid surface and the resistance plate 316 is so determined that the distance between an upper end of a meniscus, formed by the flux 70 relative to each solder ball 61, and the lower end of the solder ball 61 is kept to not more than 50% of the diameter of the solder ball 61, this provides a safe arrangement in which the arraying jig 50 is free from contamination.

Figure 45:
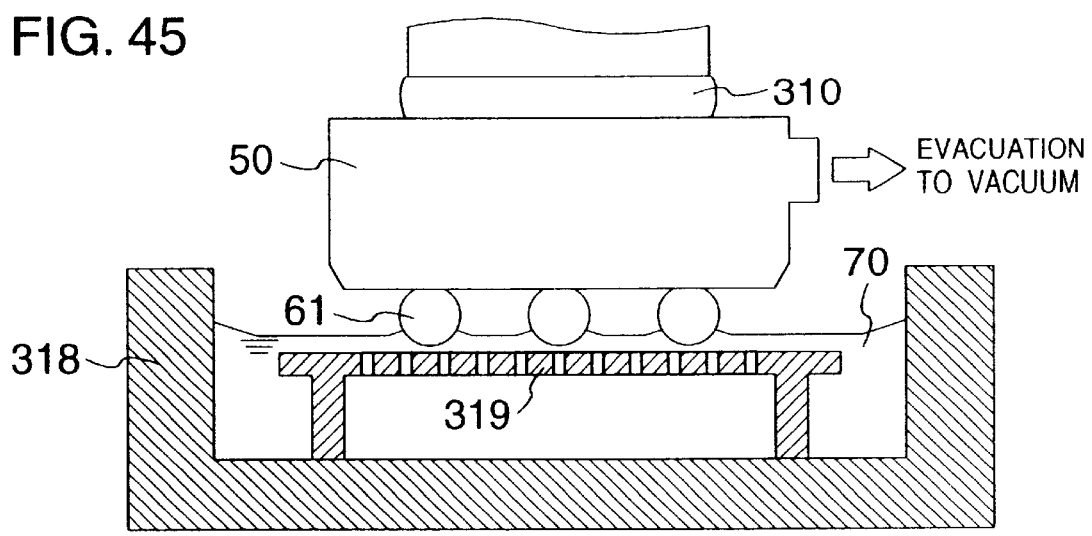
FIG. 45 is a cross-sectional view showing a sixth embodiment of a flux supply device.

In a sixth embodiment of a flux supply device shown in FIG. 45, a net-like resistance plate 319 is used.

In this construction, also, similar effects as described above can be obtained if the distance between the flux liquid surface and the upper surface of the resistance plate 319 is so determined that the distance between an upper end of a meniscus and the lower end of each solder ball 61 is kept to not more than 50% of the diameter of the solder ball 61.

Figure 46:
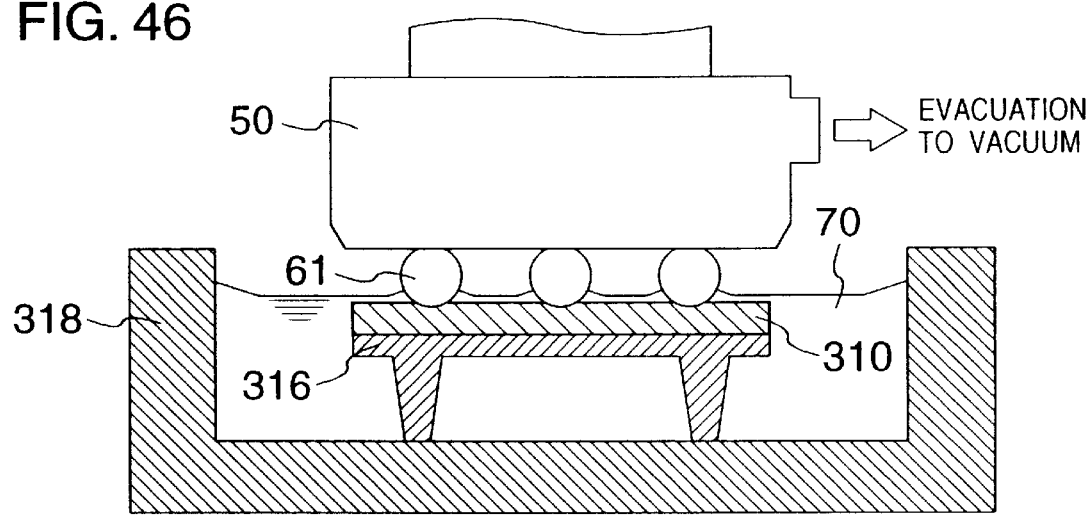
FIG. 46 is a cross-sectional view showing a seventh embodiment of a flux supply device.

In a seventh embodiment of a flux supply device shown in FIG. 46, an elastic member 310 is fixedly secured to an upper surface of a resistance plate 316.

In this construction, also, similar effects as described above can be obtained if the distance between the liquid surface of the flux 70 and the upper surface of the resistance plate 316 is so determined that the distance between an upper end of a meniscus and the lower end of each solder ball 61 is kept to not more than 50% of the diameter of the solder ball 61. And besides, even if the solder balls 61 impinge on the elastic member 310, the solder balls 61 are prevented from being disengaged from the arraying jig 50.

Figure 47:
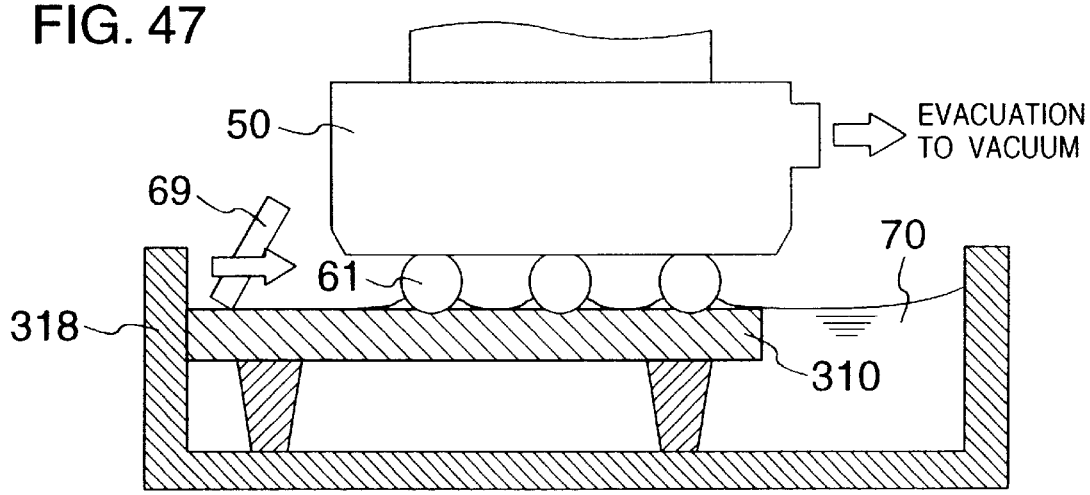
FIG. 47 is a cross-sectional view showing an eighth embodiment of a flux supply device.

In an eighth embodiment of a flux supply device shown in FIG. 47, a resistance plate 320 is formed of a porous material, and recesses, which can be opposed respectively to the solder balls 61 held by the arraying jig 50, are formed in an upper surface of the resistance plate 320, and the resistance plate 320 projects upwardly from the liquid surface of the flux 70.

In this construction, the resistance plate 320 is formed, for example, of a sponge-like, soft material or a ceramics material, and the flux 70 oozes to the surface of the resistance plate 320 by an osmotic pressure and a capillary action. Therefore, by contacting the solder balls 61, suction held by the arraying jig 50, with the respective recesses in the resistance plate 320, or pushing the solder balls 61 into the respective recesses, the flux 70 can be supplied to the solder balls 61.

Since the surface of the resistance plate 320 is exposed from the flux 70, its properties may be deteriorated as a result of drying or oxidation of the flux 70 oozed to the surface of the resistance plate 320. In such a case, a squeegee 69 is moved to scrape the flux 70 off the surface of the resistance plate 320 so that a fresh flux 70 can ooze to the surface.

Although the solder balls are used in the above embodiments, similar effects can be obtained when other conductive balls and conductive cylinders are used. Further, in the case where the conductivity is not needed, and for example, in the case of non-conductive balls, such as glass particles and plastics particles, used for setting the spacing of liquid crystal glass, similar effects can be obtained with respect to the supply of an adhesive.

In the above embodiments, although the flux is used as the adhesive liquid (or sticky liquid) for causing the solder balls to adhere to the package or the like, similar effects can be obtained when solder paste or a conductive particle-filled adhesive is used.

Figure 48:
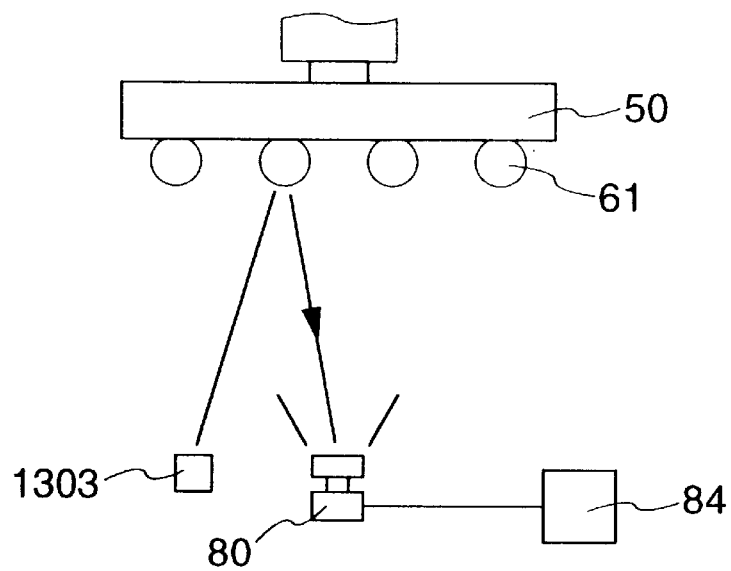
FIG. 48 is a schematic view showing a method of inspecting the arraying of solder balls.
Figure 49:
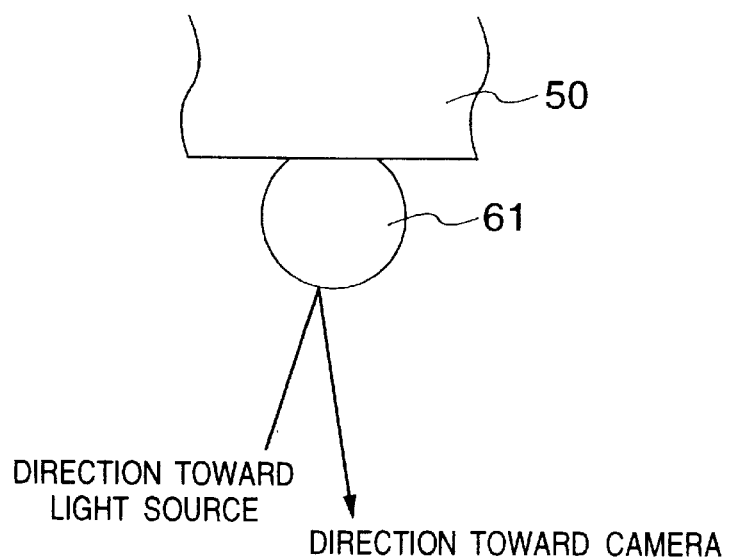
FIG. 49 is an enlarged view of a portion of FIG. 48 in the vicinity of the solder ball.
Figure 50:
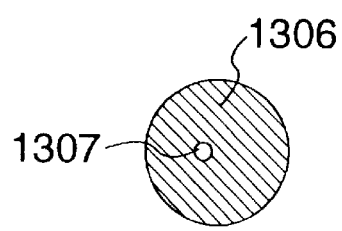
FIG. 50 is a bottom view of the solder ball in FIG. 48.

FIGS. 48 and 49 show a solder ball arraying inspection method.

The method of inspecting the array of solder balls suction held by the arraying jig 50 is performed in the following manner. An image, picked up by an image pickup camera 80 from the lower side of the solder ball 61 illuminated by an illumination light source 1303, is processed by the image processing device 84. The inspection is effected by measuring the position of a bright portion 1307 of the picked-up image of the solder ball 61 and by counting the number of the bright portions.

Figure 51:
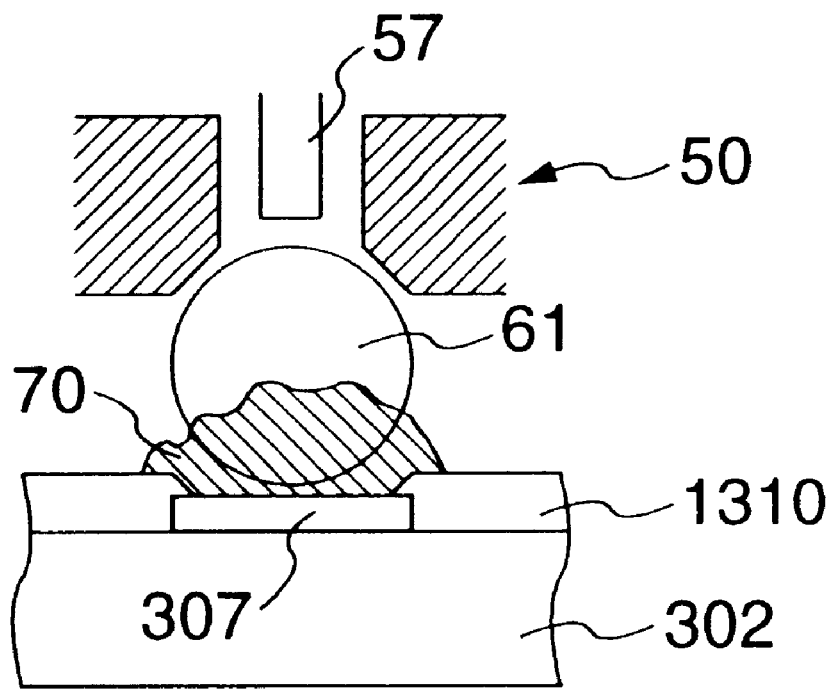
FIG. 51 is a side-elevational view showing a condition in which the solder ball is mounted on a pad on a board.

FIG. 51 shows a condition in which the solder ball is mounted on the pad on the board.

The pads 307 are formed on the board 302 of the package. A resist film 1310 is coated on the board 302 over an entire surface thereof except those regions where the pads 307 are provided.

The arraying jig 50, suction holding the solder balls 61, moves downward, and finally the interior of the arraying jig 50 is made open to the atmosphere. At the same time, the pins 57 push the solder balls 61 respectively toward the corresponding pads 307, so that the solder balls 61 are mounted on the pads 307, respectively. Each of the solder balls 61 is fixedly held on the pad 307 by an adhesive force of the flux 70.

Figure 52:
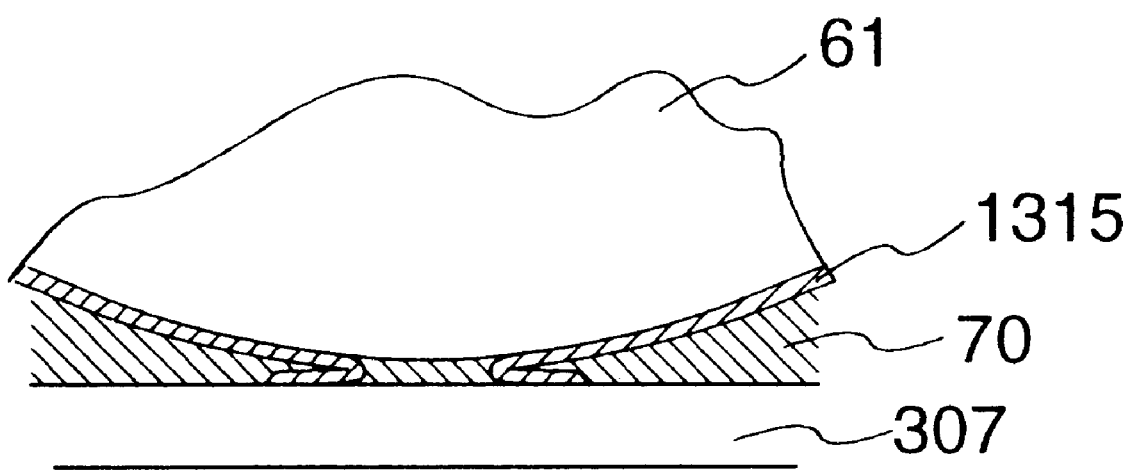
FIG. 52 is an enlarged view showing the spreading (wetting) of the solder.

Generally, the surface of the solder ball 61 is covered with an oxide film 1315 (FIG. 52). At the time of the reflow, the oxide film 1315, covering the solder ball 61, is torn by a reducing effect of the flux 70 at the time of the reflow, and the molten solder spreads from this torn portion over the pad 307 in a wetting manner. A solder bump is formed by this mechanism.

Figure 53:
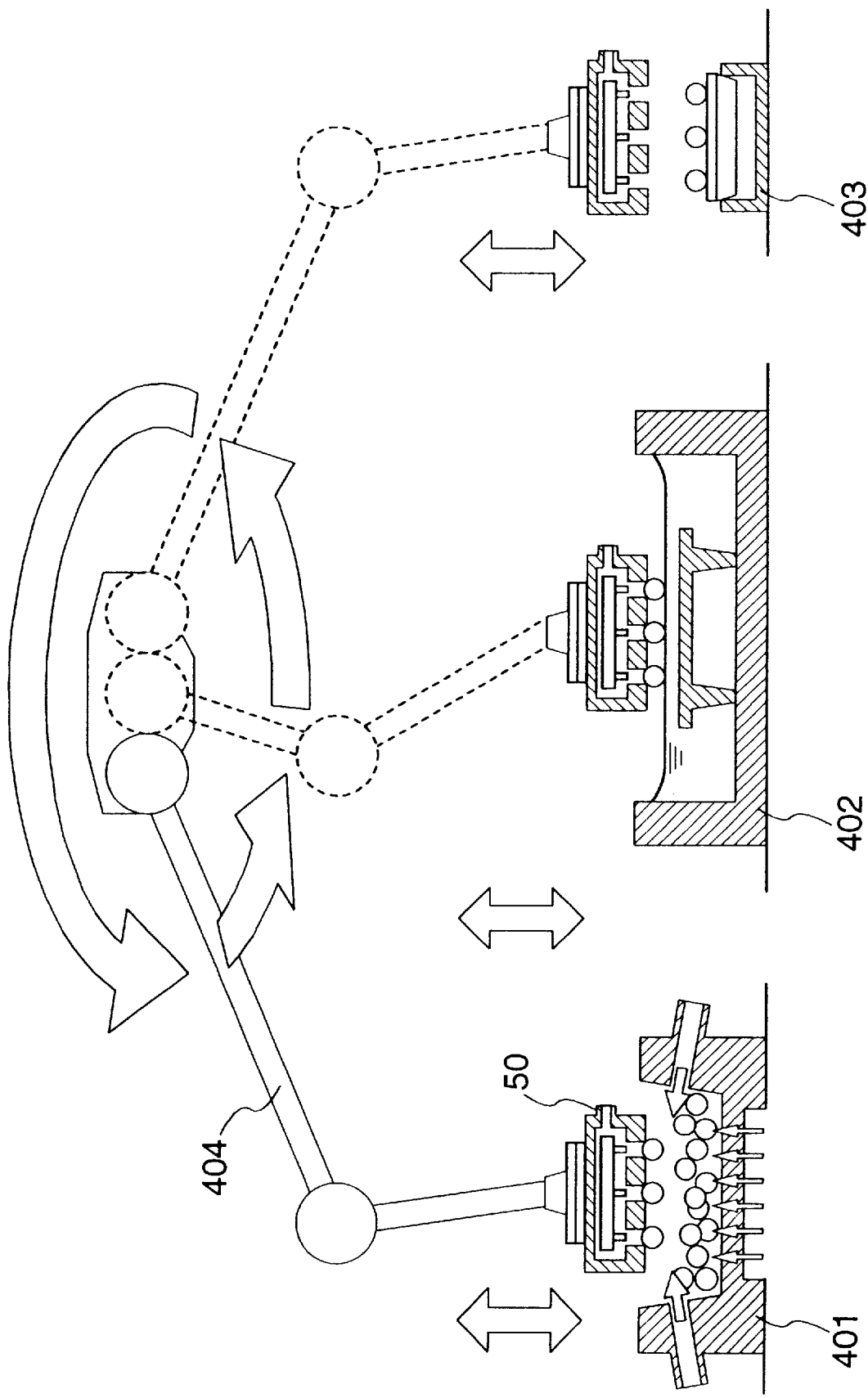
FIG. 53 is a view showing an overall construction of a third embodiment of a solder bump forming apparatus.

A third embodiment of a solder bump forming apparatus shown in FIG. 53 comprises a solder ball container portion 401 (serving as a solder ball arraying station) for containing solder balls 61, an arraying jig 50 for vacuum picking up the solder balls 61 from the container portion 401 and for arraying these solder balls 61, a flux supply device 402 (serving as a flux supplying station) for supplying a flux 70 to the solder balls 61 suction held by the arraying jig 50, a solder ball mounting station 403 for mounting the solder balls 61, suction held by the arraying jig 50, onto the board, conveying means (robot) 404 for moving the arraying jig 50 between the stations and for vertically moving the arraying jig 50 in each of the stations, and a reflow oven (not shown). Hereafter, the arraying jig 50 is moved by the robot 404 unless specified otherwise.

Figure 54:
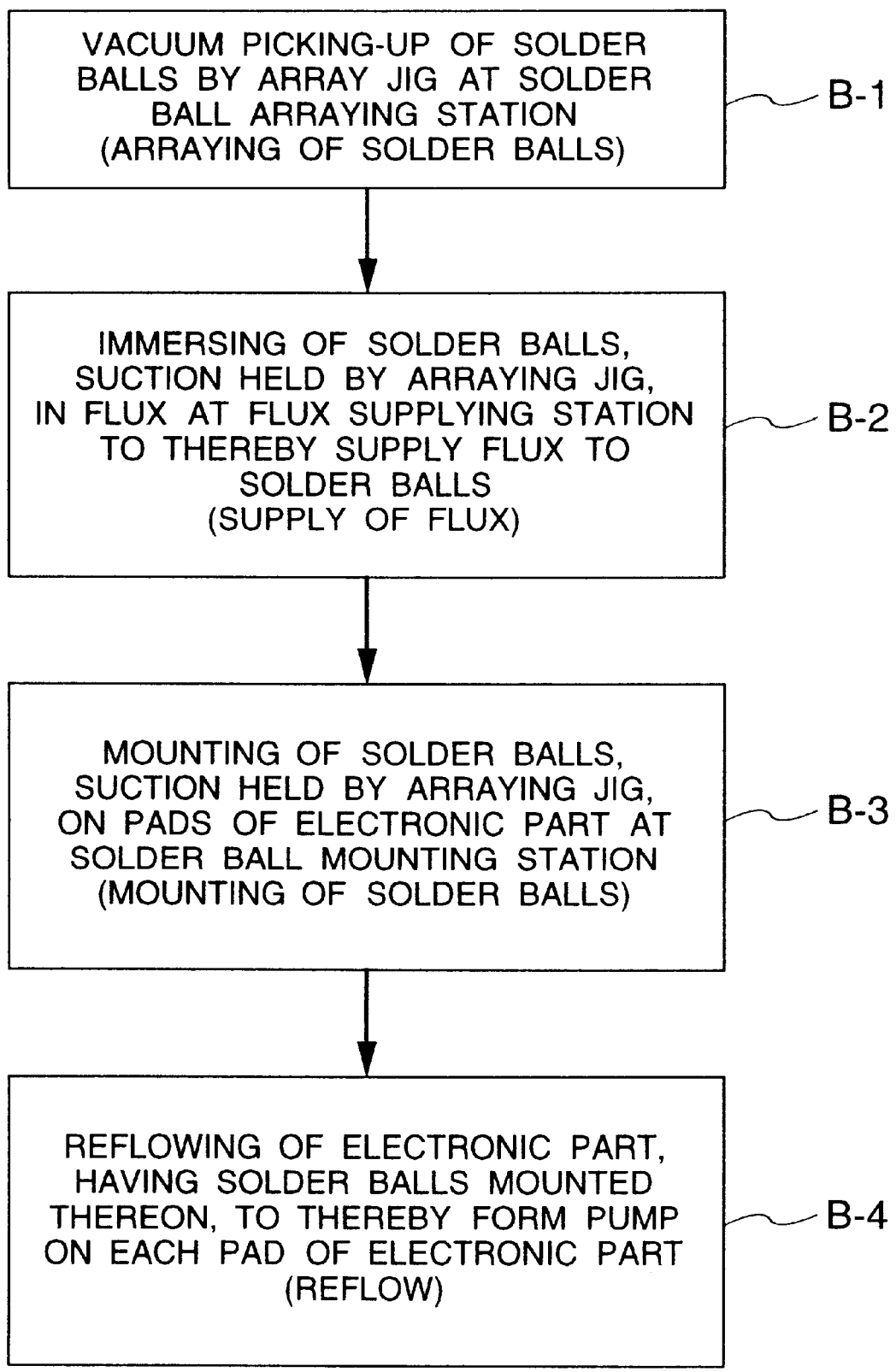
FIG. 54 is a flow chart of the process of FIG. 53.

The arraying jig 50 is moved to the solder ball container portion 401, and a required number of solder balls 61 are suction held by the arraying jig 50 in an arrayed manner (Step B-1 in FIG. 54). Then, the arraying jig 50 is moved to the flux supplying station 402, and is lowered to immerse the solder balls 61 in the flux 70, thereby supplying the flux 70 to the solder balls 61 (Step B-2 in FIG. 54). After the flux 70 is thus supplied to the solder balls 61, the arraying jig 50 is moved upward.

Then, the arraying jig 50 is moved to the solder ball mounting station 403, and is positioned above the board onto which the solder balls 61 are to be mounted. Then, the arraying jig 50 is lowered to mount the solder balls 61 respectively on the pads on the board (Step B-3 in FIG. 54). Each of the solder balls 61 is provisionally fixedly held on the pad by an adhesive force of the flux 70. Thereafter, the board, having the solder balls 61 mounted thereon, is conveyed to the reflow oven by a conveyor or the like. The solder balls 61 are heated and melted in the reflow oven, and then are cooled to form solder bumps, respectively (Step B-4 in FIG. 54).

The arraying jig, the solder ball supplying station, the flux supplying station, the detection station, the solder ball mounting station and so on in this embodiment can be constituted by suitably combining the devices and portions described in the above embodiments. Although not shown in the drawings, a CCD camera is provided between any two adjacent ones of the stations. In this construction, similar effects as in the above embodiments can be obtained.

Figure 55:
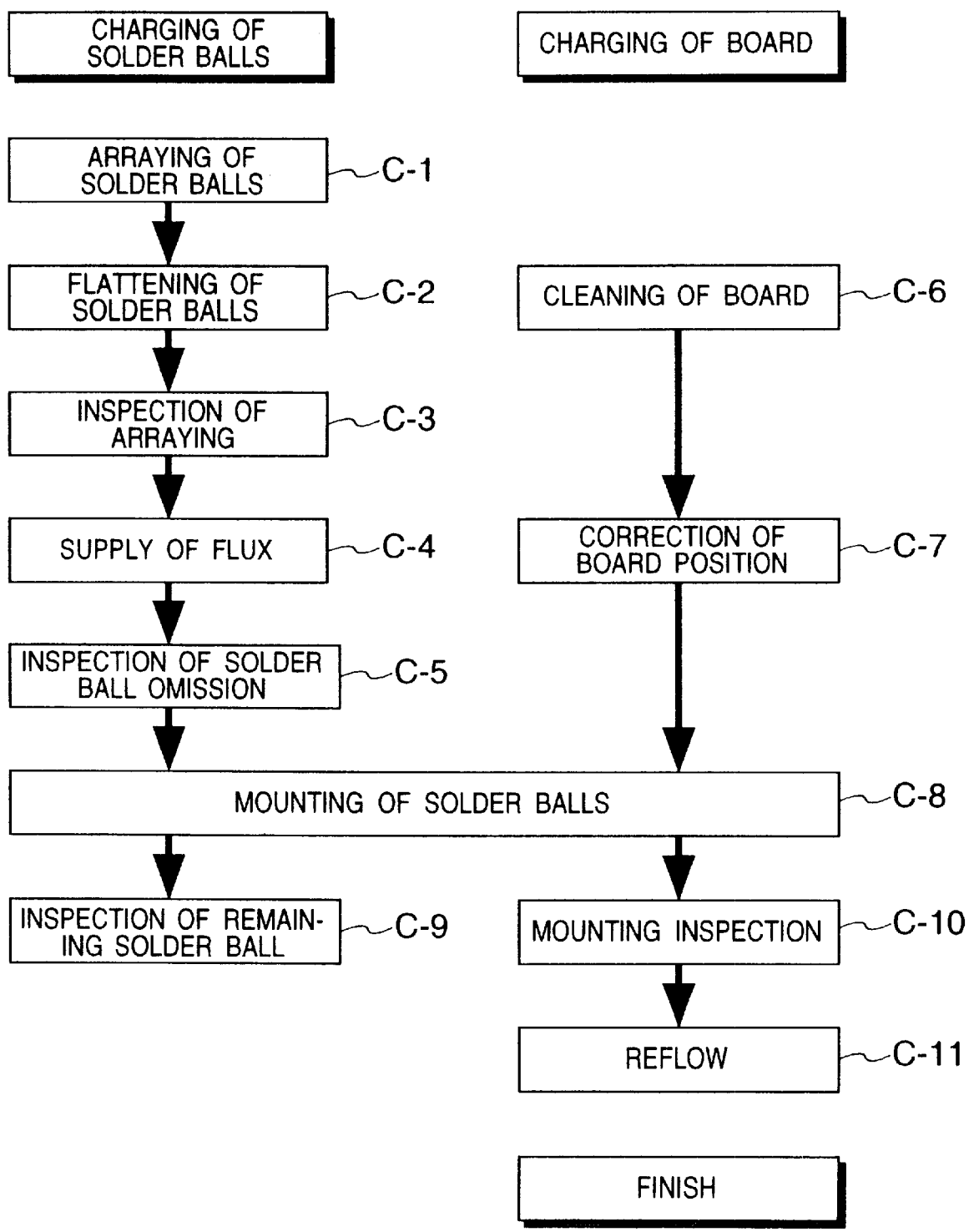
FIG. 55 is a flow chart showing a fourth embodiment of a solder bump forming method.

In a bump forming method according to a further embodiment shown in FIG. 55, solder balls are suction held by an arraying jig in an arrayed manner (Step C-1). Then, lower surfaces of the solder balls are flattened (Step C-2). Then, it is checked whether or not the arraying of the solder balls is good (Step C-3). Then, a flux is supplied to the solder balls (Step C-4). Then, it is checked whether or not any of the solder balls has been disengaged from the arraying jig to be omitted from the solder ball array at the time of supplying the flux. Thus, there are prepared the arrayed solder balls supplied with the flux.

On the other hand, a board (whose bump forming surface is cleaned (Step C-6), for example, by application of beam pulses from a carbon dioxide laser if necessary) is fed to a solder ball mounting device, and then pads (on which the bumps are to be formed, respectively) on the board are located in solder ball mounting positions, respectively (Step C-7). Then, the solder balls are mounted onto the thus positioned board (Step C-8).

Then, it is checked whether or not any solder ball remains on the suction surface of the arraying jig used to array the solder balls (Step C-9), and the number of the solder balls on the pads on the board, as well as misregistration of these solder balls, is inspected (Step C-10), thereby confirming whether or not the mounting of the solder balls has been effected properly.

The board, thus having the solder balls mounted thereon, is placed in a high-temperature environment, and as a result the solder balls are melted to be joined respectively to the pads on the board, and then are cooled (Step C-11) to form the solder bumps respectively on the pads on the boars.

In this embodiment, the solder balls are flattened, and therefore the solder balls can be detected easily. And besides, the area of contact between each solder ball and the pad on the board when mounting the solder balls to the board is increased, and this prevents the movement of the solder ball due to a surface force of the flux, so that the mounting operation can be effected more stably. Further, even if the pads of the board are contaminated with an organic substance deposited thereon, the positive bonding of the solder to the pads by the reflow can be secured.

Figure 56:
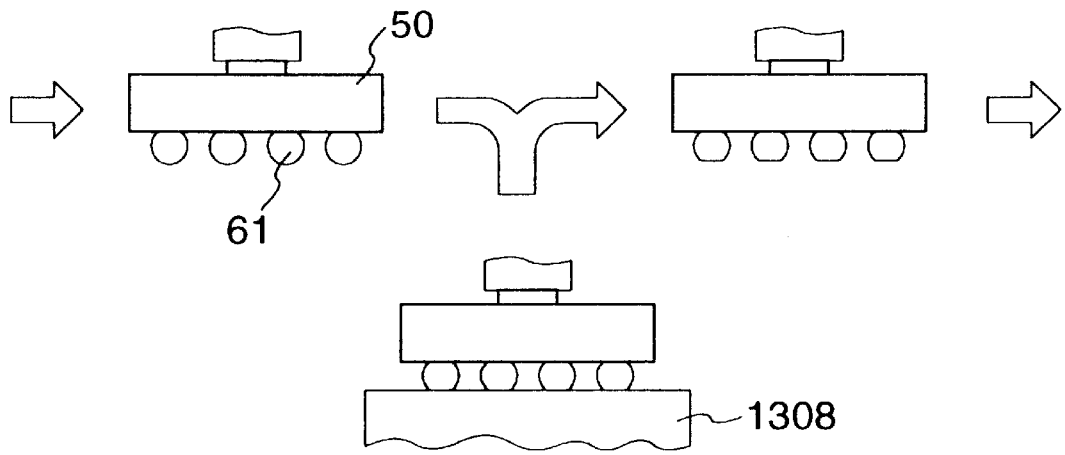
FIG. 56 is a process view showing a first embodiment of a solder ball-flattening step.

As shown in FIG. 56, the solder balls are flattened by a method in which the solder balls 61, suction held by the arraying jig 50 in an arrayed manner, are pressed against a rigid plate 1308, and are plastically deformed, thereby flattening the lower ends or bottoms of the solder balls 61.

This rigid plate 1308 is provided, for example, between the solder ball supply device 200 and the CCD camera 80 in FIG. 7.

Figure 57:
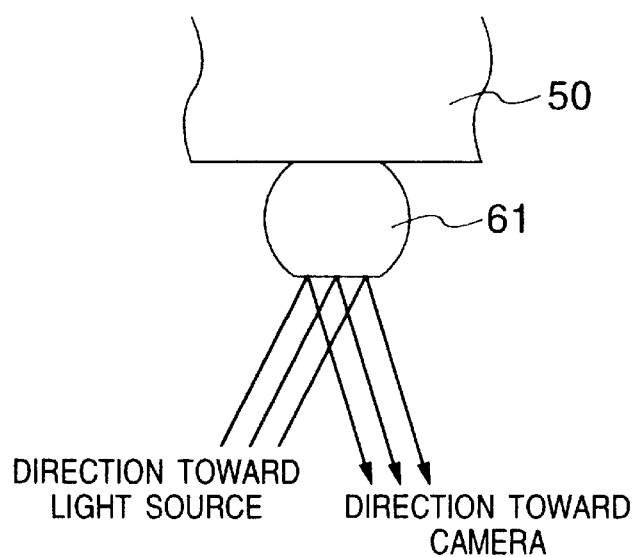
FIG. 57 is a side-elevational view showing a method of detecting the solder ball having its bottom flattened.
Figure 58:
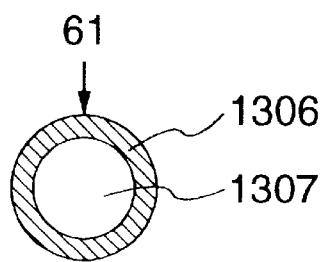
FIG. 58 is a bottom view showing the method of detecting the solder ball having its bottom flattened.

As shown in FIGS. 57 and 58, in the case of the solder balls 61 which are suction held and arrayed by the arraying jig 50, and have the respective flattened bottom surfaces, the area of a regularly-reflecting surface 1307 out of a surface 1306 reflecting illumination light, emitted from a light source, toward a camera, is much larger than that shown in FIG. 49. Therefore, in the image processing at the time of the arraying inspection, the solder balls 61 can be easily recognized. As a result, recognition errors at the time of the arraying inspection are reduced, and the high-speed arraying inspection can be effected.

Figure 59:
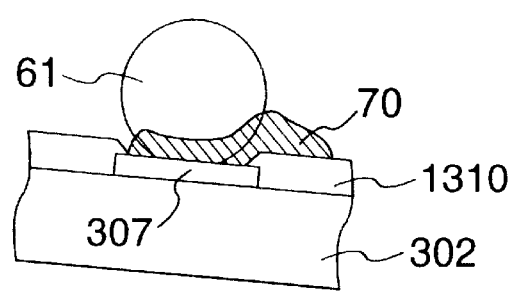
FIG. 59 is an enlarged view showing a condition in which the flattened solder ball is mounted on a board.

By flattening the bottom surfaces of the solder balls 61, the area of contact between each solder ball 61 and the pad 307 on the board 302 is increased as shown in FIG. 59, and therefore the solder balls 61 can be stably mounted respectively on the pads 307 on the board 302, and this prevents the movement of the solder ball 61 due to a surface force of the flux 70.

Figure 60:
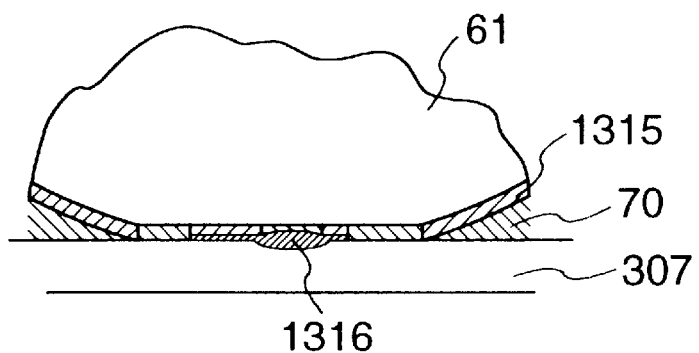
FIG. 60 is an enlarged view showing a condition of the solder ball at the time of reflow.
Figure 61:
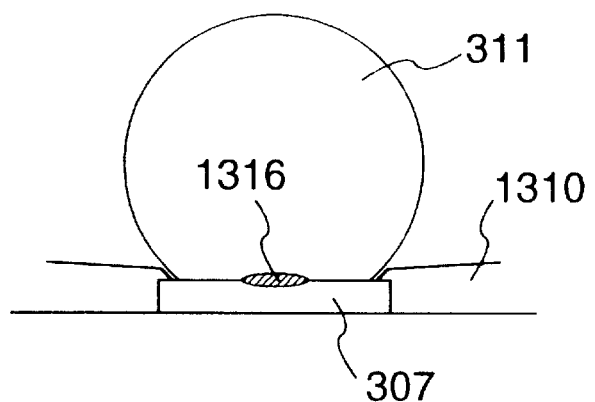
FIG. 61 is an enlarged view showing a condition of the solder ball after the reflow.

As shown in FIG. 60, even if a foreign matter is present on the pad 307 on the board, the solder can spread over the pad 307 in a wetting manner since an oxide film 1315, covering the solder ball 61, are torn at a plurality of portions thereof by a reducing effect of the flux 70 at the time of the reflow. Therefore, as shown in FIG. 61, the solder bump 1317, properly connected to the pad, can be formed.

Figure 62:
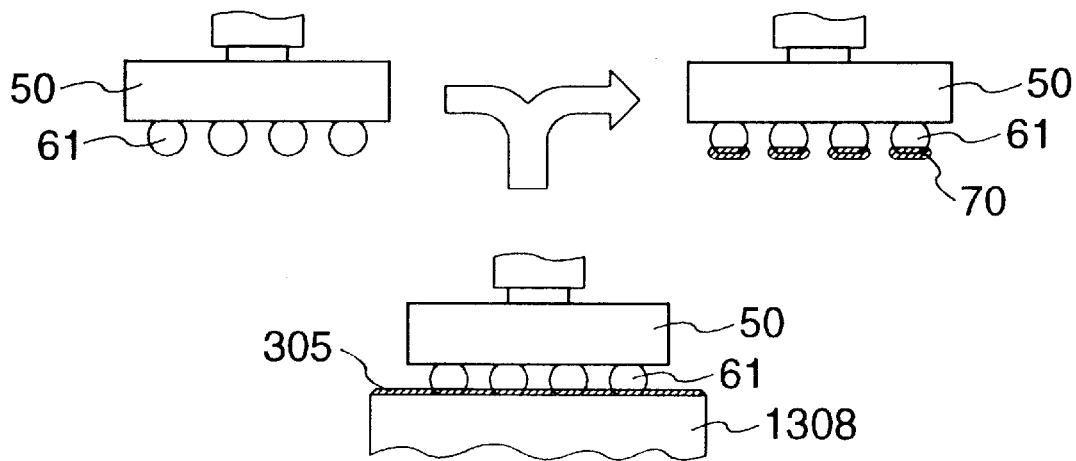
FIG. 62 is a process view showing a second embodiment of a solder ball-flattening step.

As shown in FIG. 62, there may be used another method of flattening the bottom surfaces of the solder balls, in which the resistance plate of the flux supply device is constituted by a rigid plate 1308, and the solder balls 61 are pressed against the rigid plate 1308 when supplying the flux 70 to the solder balls 61, thereby flattening the bottoms of the solder balls 61.

Figure 63:
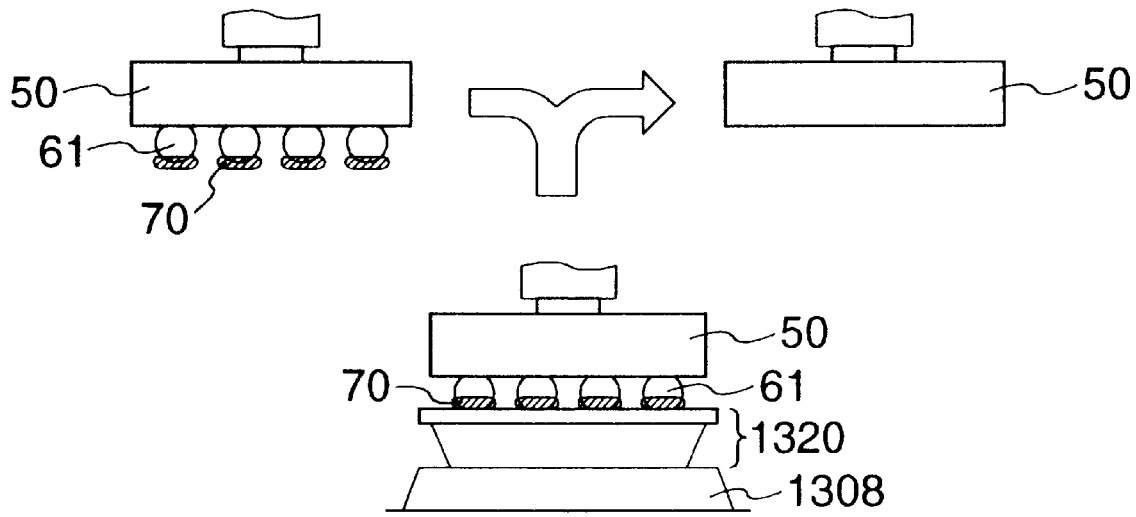
FIG. 63 is a process view showing a third embodiment of a solder ball-flattening step.
Figure 64:
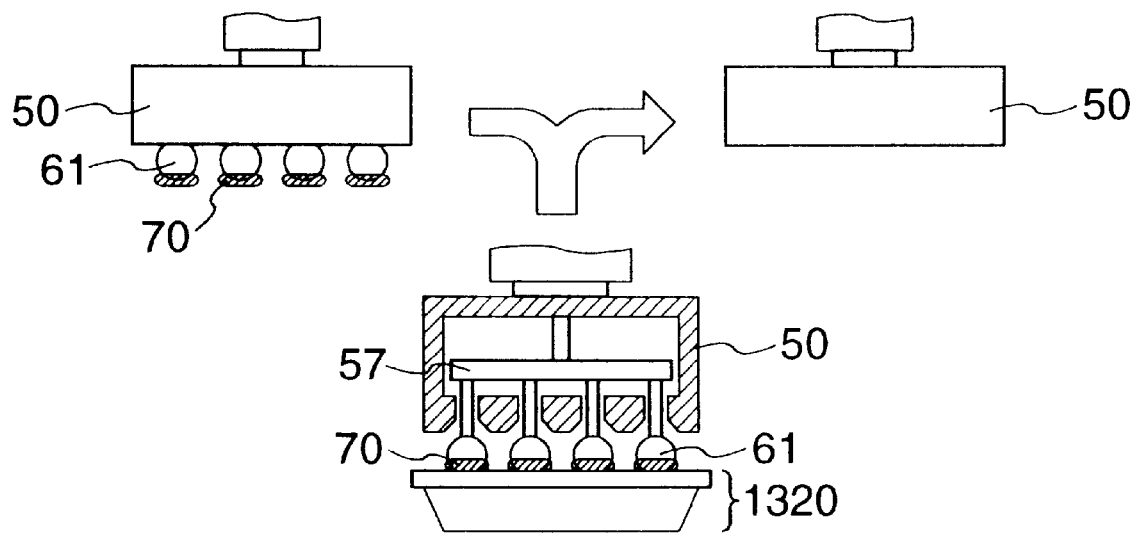
FIG. 64 is a side-elevational view of FIG. 63.
Figure 65A:
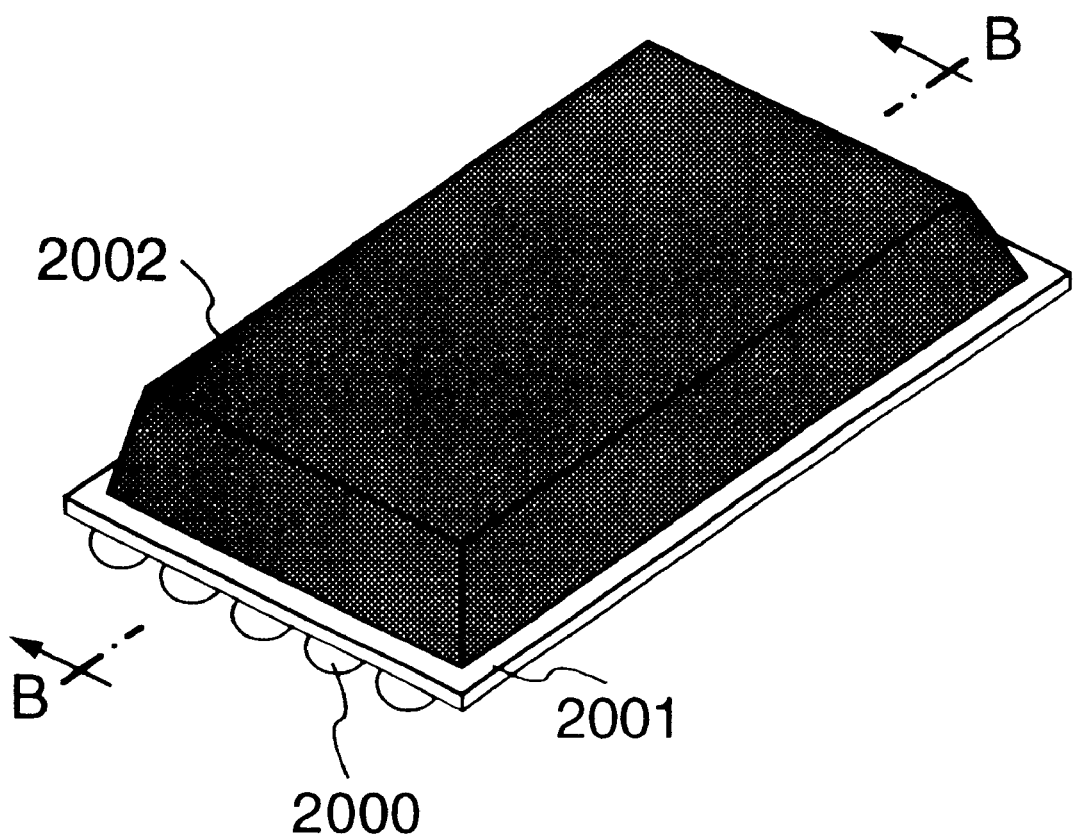
FIG. 65A is a perspective view showing one example of electronic part to which the present invention is applied.
Figure 65B:
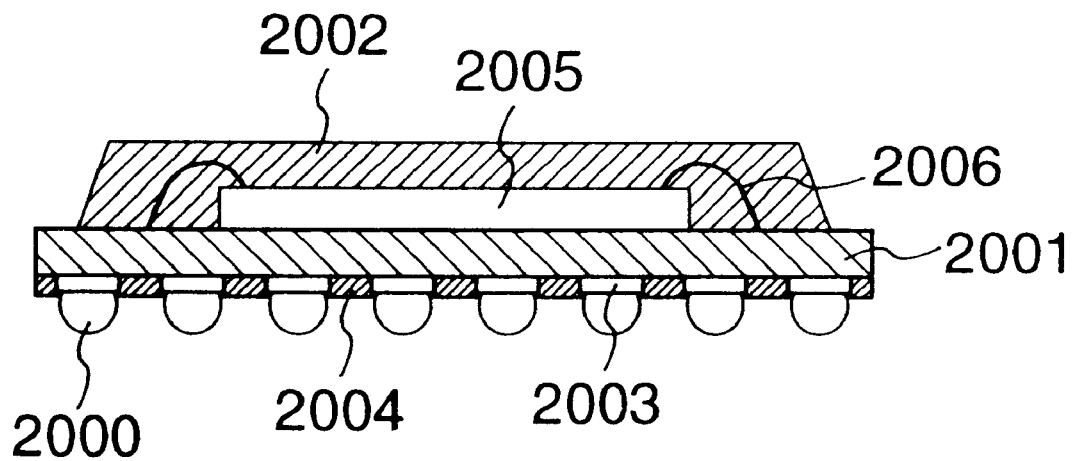
FIG. 65B is a cross-sectional view taken along the line B—B of FIG. 65A.
Figure 66:
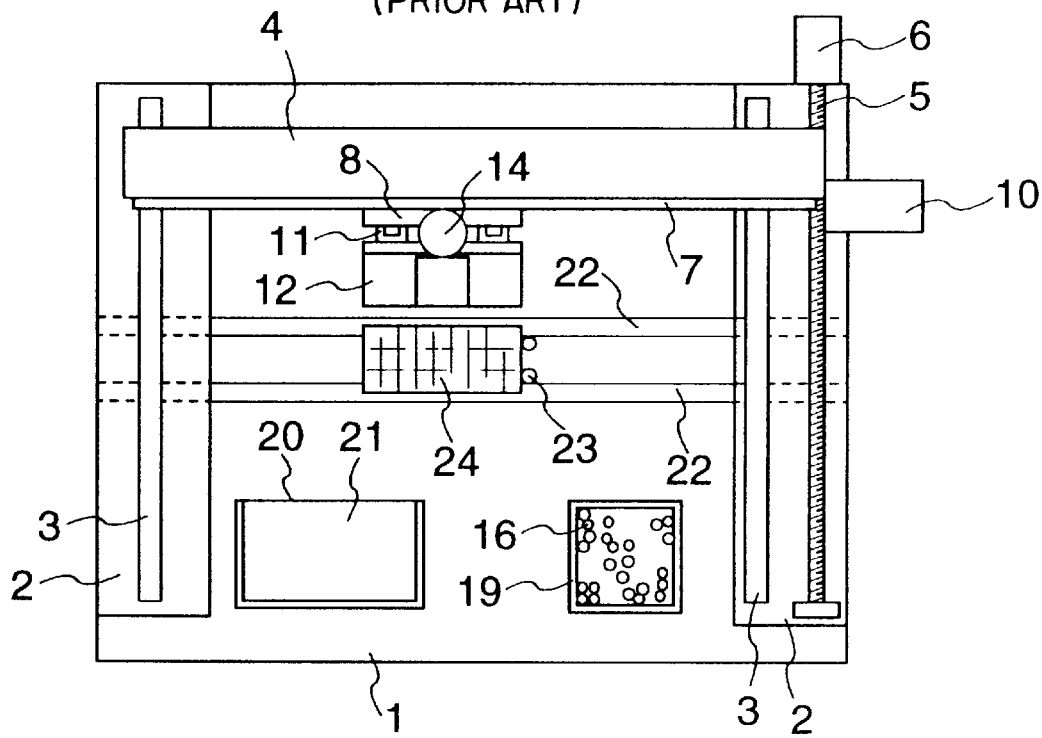
FIG. 66 is a plan view of a conventional solder ball mounting machine.
Figure 67:
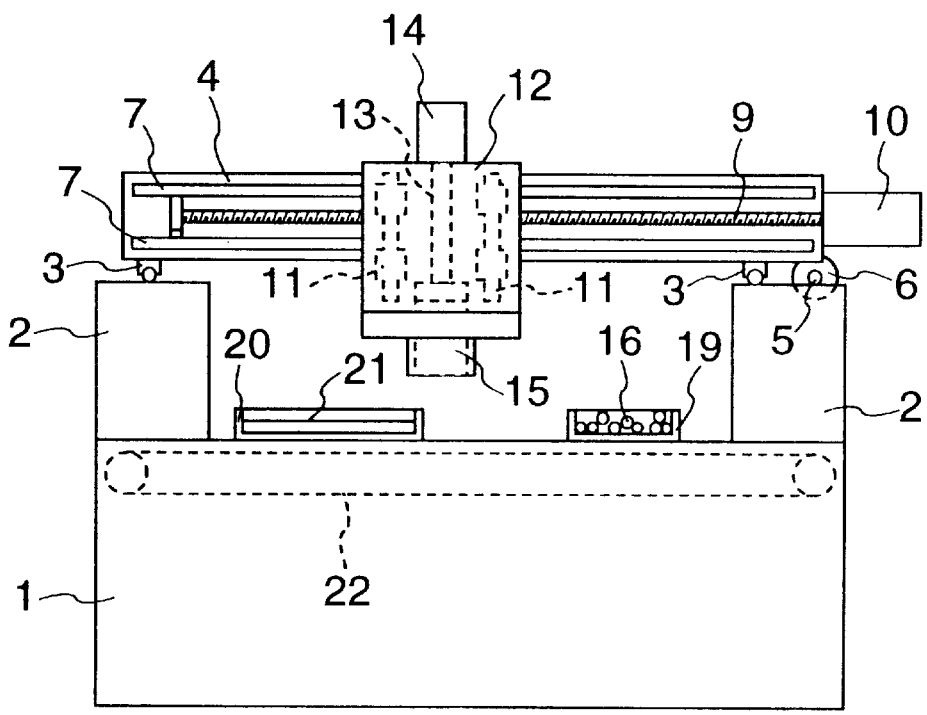
FIG. 67 is a front-elevational view of the machine of FIG. 66.
Figure 68:
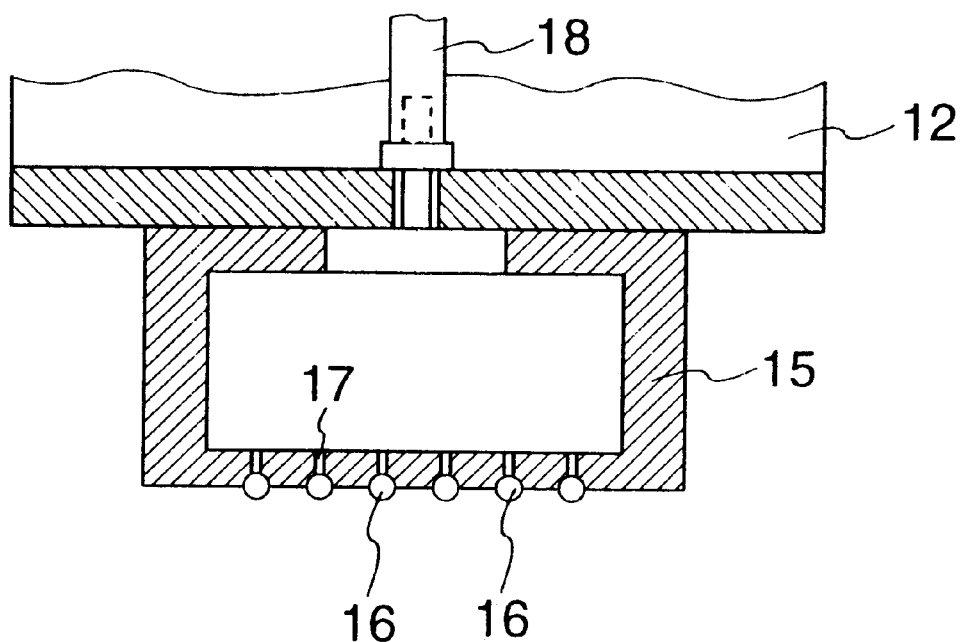
FIG. 68 is a cross-sectional view of an arraying jig in FIG. 66.
Figure 69:
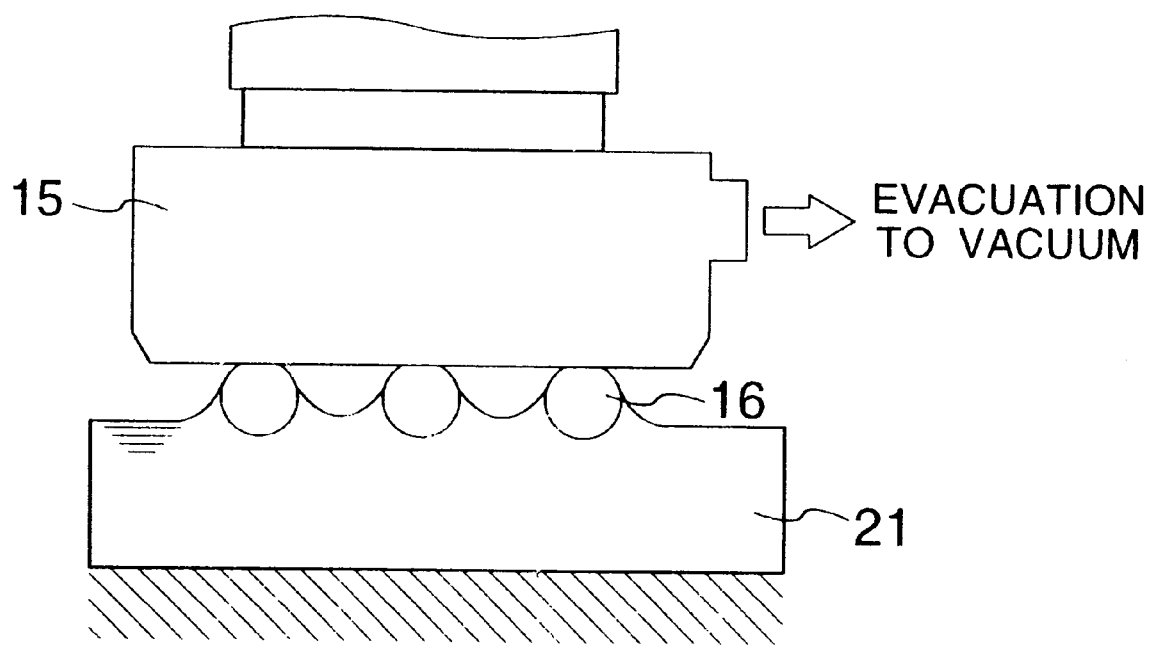
FIG. 69 is an enlarged view showing a condition of wetting of a flux relative to solder balls.
Figure 70:
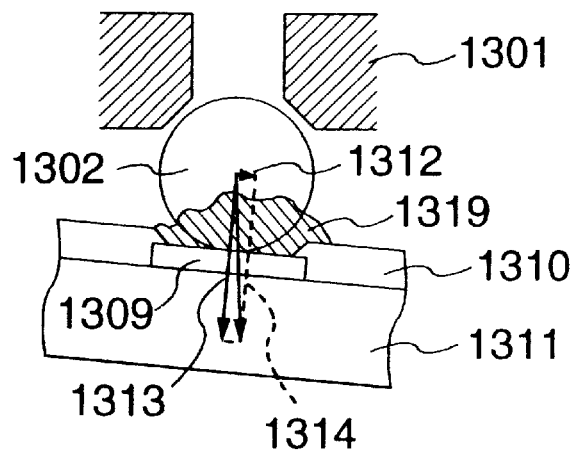
FIG. 70 is an enlarged view showing displacement of the solder ball occurring when a board is inclined.
Figure 71:
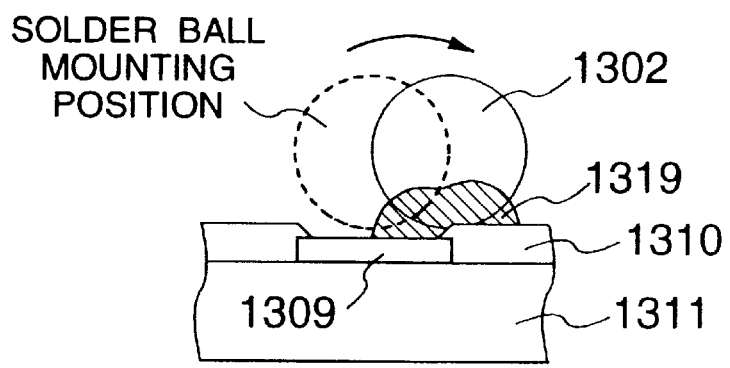
FIG. 71 is an enlarged view showing displacement of the solder ball due to misregistration of the flux.
Figure 72:
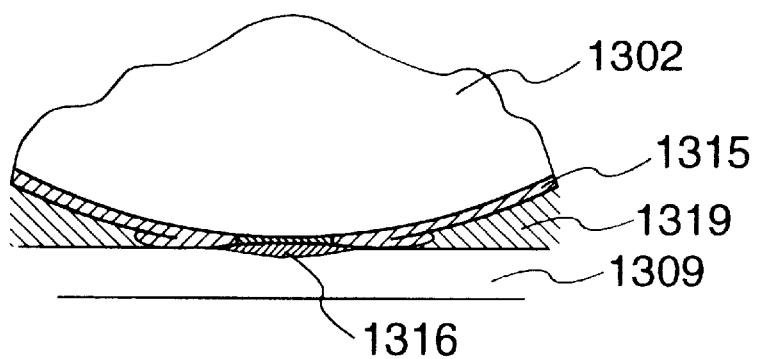
FIG. 72 is an enlarged view showing a condition of the solder ball at the time of the reflow.

As shown in FIGS. 63 and 64, there may be used a further method of flattening the bottom surfaces of the solder balls, in which an electronic part 1320 is placed on a rigid plate 1308, and when mounting the solder balls 61 onto the electronic part 1320, the solder balls 61 are pressed against the electronic part 1320 by respective pins 57, thereby flattening the bottoms of the solder balls 61.

As described above, in the present invention, it is possible to adopt the construction of the apparatus in which the suction hold of the solder balls by the arraying jig, the supply of the flux to the solder balls, and the mounting of the solder balls on the package can be effected at the same time, and therefore there can be provided the solder ball mounting machine in which the apparatus cycle time is shortened, and the efficiency of the operation is high.

The CCD cameras are provided, and the lower surface of the arraying jig is monitored by the CCD cameras, and by doing so, undesirable conditions can be checked, and the production of the defective products can be prevented.

There are provided one CCD camera for detecting the reference, such as registration marks or pads of the package, the mechanism for correcting the position of the package, and the controller, and before mounting the solder balls, the arraying jig is registered with the package, and the condition of mounting of the solder balls on the respective pads on the package is confirmed.

By the above check functions, the mounting of the solder balls can be effected with high reliability, and also the defective products can be checked, and therefore the productivity can be enhanced.

The resistance plate for applying a fluid resistance to the flux is provided near to the surface of the flux in the flux supply device, and with this construction, when immersing the solder balls in the flux, the flux is prevented from wettingly rising to adhere to the arraying jig. Therefore, the flux, having good wettability, can be continuously supplied to the solder ball with the simple mechanism, and also an error of the vacuum picking-up and the solder ball mounting due to the adherence of the flux on the arraying jig is prevented.

For dealing with warpage of the board, the suction surface of the arraying jig, as well as the array of pins, is so constructed as to conform to warpage of the board, and also there is provided the screen for preventing a plurality of solder balls from being suction held in one suction hole, so that the solder balls can be vacuum picked up by the arraying jig in a short time period, and further in order that the kind of the package can be easily changed, there are provided the easily-detachable screen plates corresponding respectively to the packages of different kinds. Therefore, the solder balls can be positively mounted even on the warped board, and the time required for vacuum picking up the solder balls is shortened, and the mask and the array of pins do not need to be exchanged depending on the kind of the package.

With respect to stains on the pads of the package, the surfaces of the pads are cleaned within the solder ball mounting machine before mounting the solder balls thereon. By dosing so, the incomplete wetting of the pads by the solder is eliminated, so that the bumps of high reliability can be formed.

Part of each solder ball is flattened, and therefore the inspection of the arraying of the solder balls can be carried out easily, and the displacement of the solder balls mounted on the respective pads are prevented, and even if the pad is slightly stained, the incomplete solder wetting is prevented.

The flux supply plate, having the recesses, is used for supplying the flux to the solder balls, and therefore the flux can be supplied highly precisely such that the amount of supply of the flux does not much vary from one solder ball to another. Therefore, the amount of the flux supplied to each solder ball is not larger or smaller than the proper amount, and defects due to such an improper amount of the supplied flux are prevented, so that the bump formation can be carried out continuously in a stable manner.

The solder balls are supplied to the arraying jig by evacuation and the air blowing, and also by moving the air blow-up nozzle at the lower side of the container containing the solder balls, and therefore the solder balls can be blown up uniformly, and the solder balls can be highly precisely supplied.

Even when a plurality of solder balls are vacuum picked up in one suction hole in the arraying jig, the extra solder ball can be removed therefrom by using the mask plate (which prevents a plurality of solder balls from being vacuum picked up in the suction hole), by using the brush or the blade, or by blowing the air.

In the above construction, the bumps of high reliability can be formed, and the less-costly electronic parts, having the bumps, can be supplied to the market.

What is claimed is:

1. A bump forming method comprising the steps of:
preparing conductive balls having a predetermined diameter;
preparing an arraying jig formed therein with suction holes and having a suction surface side, said suction holes having a diameter which is smaller than the predetermined diameter of said conductive balls at at least said suction surface side;
causing said arraying jig to vacuum pick up said conductive balls;
applying an adhesive liquid to said conductive balls;
registering said conductive balls respectively with pads on an electronic part;
pressing said conductive balls respectively against said pads on said electronic part to mount said conductive balls thereon; and
heat treating said electronic part having said conductive balls mounted thereon,
in which in said step of applying said adhesive liquid to said conductive balls, said conductive balls are brought near to or into contact with an adhesive liquid wetting resistance plate so as to apply said adhesive liquid to said conductive balls, and
in which in said step of applying said adhesive liquid to said conductive balls, a resistance plate for applying a fluid resistance to a fixing liquid is provided near to the surface of said adhesive liquid, and said adhesive liquid is applied to said conductive balls.

2. A bump forming method comprising the steps of:
preparing conductive balls having a predetermined diameter;
preparing an arraying jig formed therein with suction holes and having a suction surface side, said suction holes having a diameter which is smaller than the predetermined diameter of said conductive balls at at least said suction surface side;
causing said arraying jig to vacuum pick up said conductive balls;
applying an adhesive liquid to said conductive balls;
registering said conductive balls respectively with pads on an electronic part;
pressing said conductive balls respectively against said pads on said electronic part to mount said conductive balls thereon; and
heat treating said electronic part having said conductive balls mounted thereon,
in which in said step of applying said adhesive liquid to said conductive balls, said conductive balls are brought near to or into contact with an adhesive liquid wetting resistance plate so as to apply said adhesive liquid to said conductive balls, and
in which in said step of applying said adhesive liquid to said conductive balls, said adhesive liquid wetting resistance plate is made of an elastic material.

3. A bump forming apparatus comprising:
an arraying jig formed therein with suction holes through which conductive balls having a predetermined diameter are sucked up, said arraying jig having suction surface side, said suction holes having a diameter which is smaller than the predetermined diameter of said conductive balls at at least said suction surface side;
means for causing said arraying jig to vacuum pick up said conductive balls;
means for applying an adhesive liquid to said conductive balls;
means for registering said conductive balls respectively with pads on an electronic part;
means for pressing said conductive balls respectively against said pads on said electronic part to mount said conductive balls thereon; and means for heat treating said electronic part having said conductive balls mounted thereon;

in which said means for applying said adhesive liquid to said conductive balls includes an adhesive liquid wetting resistance plate, and in which said adhesive liquid wetting resistance plate is made of an elastic material.

4. A bump forming apparatus comprising:

an arraying jig formed therein with suction holes through which conductive balls having a predetermined diameter are sucked up, said arraying jig having suction surface side, said suction holes having a diameter which is smaller than the predetermined diameter of said conductive balls at at least said suction surface side;

means for causing said arraying jig to vacuum pick up said conductive balls;

means for applying an adhesive liquid to said conductive balls;

means for registering said conductive balls respectively with pads on an electronic part;

means for pressing said conductive balls respectively against said pads on said electronic part to mount said conductive balls thereon; and means for heat treating said electronic part having said conductive balls mounted thereon;

in which there are provided a plurality of said arraying jigs, and there is provided means for concurrently effecting the step of causing said arraying jig to vacuum pick up conductive balls, the step of applying said adhesive liquid to said conductive balls, and the step of pressing said conductive balls respectively against said pads on said electronic part to mount said conductive balls.

5. A bump forming apparatus comprising:

an arraying jig formed therein with suction holes through which conductive balls having a predetermined diameter are sucked up, said arraying jig having suction surface side, said suction holes having a diameter which is smaller than the predetermined diameter of said conductive balls at at least said suction surface side;

means for causing said arraying jig to vacuum pick up said conductive balls;

means for applying an adhesive liquid to said conductive balls;

means for registering said conductive balls respectively with pads on an electronic part;

means for pressing said conductive balls respectively against said pads on said electronic part to mount said conductive balls thereon; and means for heat treating said electronic part having said conductive balls mounted thereon;

a vertically-movable table rotatably indexable at a predetermined angle; a plurality of said arraying jigs spaced from one another at predetermined intervals in a direction of rotation of said table, each of said arraying jigs having suction holes for respectively suction holding said conductive balls; a conductive ball supply device having a plurality of small holes formed in a bottom surface for blowing gas so as to float said conductive balls by said gas; an adhesive liquid supply device which comprises a rotatable disk, and a squeegee spaced a predetermined distance from a surface of said disk in opposed relation thereto, said adhesive liquid supply device forming said adhesive liquid, supplied to the surface of said disk, into a liquid film; and a positioning device for positioning said electronic part on which said conductive balls are to be mounted; wherein said conductive ball supply device, said adhesive liquid supply device and said positioning device are arranged in the direction of rotation of said table so that each of said arraying jigs can be opposed sequentially to said conductive ball supply device, said adhesive liquid supply device and said positioning device at respective indexed positions of said arraying jigs.

6. Apparatus according to claim 4, in which there are provided a plurality of image pickup devices and an image processing device for processing images picked up by said image pickup devices, and said image pickup devices are provided between said conductive ball supply device and said adhesive liquid supply device, between said adhesive liquid supply device and said positioning device and between said positioning device and said conductive ball supply device, respectively, in such a manner that said image pickup devices can face each of said arraying jigs, whereby there is provided a function of inspecting the condition of suction holding of said conductive balls by said arraying jigs at each of the steps.

7. Apparatus according to claim 4, in which an image pickup device is provided above a positioning device so as to face a conductive ball-mounting surface of said electronic part, and the positions of the pads on the said electronic part are detected, and a relative position between said electronic part and said arraying jig is calculated, and an error in the relative position is corrected by said positioning device, and the number and positions of said conductive balls after mounting said conductive balls on said electronic parts are inspected.

* * * * *